(12) United States Patent
Hashimoto et al.

(10) Patent No.: US 12,040,155 B2
(45) Date of Patent: Jul. 16, 2024

(54) METHOD OF MANUFACTURING SEMICONDUCTOR DEVICE AND ION BEAM IRRADIATION APPARATUS

(71) Applicant: Kioxia Corporation, Tokyo (JP)

(72) Inventors: Junichi Hashimoto, Yokkaichi (JP); Toshiyuki Sasaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 250 days.

(21) Appl. No.: 17/472,444

(22) Filed: Sep. 10, 2021

(65) Prior Publication Data
US 2022/0301809 A1   Sep. 22, 2022

(30) Foreign Application Priority Data

Mar. 22, 2021  (JP) ................ 2021-047982

(51) Int. Cl.
| | |
|---|---|
| *C23C 16/04* | (2006.01) |
| *C23C 16/40* | (2006.01) |
| *C23C 16/48* | (2006.01) |
| *C23C 16/52* | (2006.01) |
| *H01J 37/147* | (2006.01) |
| *H01J 37/32* | (2006.01) |
| *H01L 21/02* | (2006.01) |
| *H01L 21/263* | (2006.01) |
| *H01L 21/768* | (2006.01) |
| *H10B 43/50* | (2023.01) |
| *H10B 43/27* | (2023.01) |

(52) U.S. Cl.
CPC ........ *H01J 37/1474* (2013.01); *C23C 16/047* (2013.01); *C23C 16/402* (2013.01); *C23C 16/486* (2013.01); *C23C 16/52* (2013.01); *H01J 37/3233* (2013.01); *H01L 21/02164* (2013.01); *H01L 21/02266* (2013.01); *H01L 21/2633* (2013.01); *H01L 21/76819* (2013.01); *H10B 43/50* (2023.02); *H01J 2237/334* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 6,288,357 B1 | 9/2001 | Dyer | |
| 7,335,580 B1 | 2/2008 | Buerger, Jr. et al. | |
| 8,313,663 B2 * | 11/2012 | Hautala | B44C 1/227 |
| | | | 216/66 |
| 9,466,537 B2 | 10/2016 | Kim et al. | |
| 10,347,502 B2 | 7/2019 | Park | |
| 2018/0292745 A1 * | 10/2018 | Kirkpatrick | G03F 1/82 |
| 2020/0126756 A1 | 4/2020 | Franco et al. | |

* cited by examiner

*Primary Examiner* — Binh X Tran
*Assistant Examiner* — Bradford M Gates
(74) *Attorney, Agent, or Firm* — Oblon, McClelland, Maier & Neustadt, L.L.P.

(57) ABSTRACT

A method of manufacturing a semiconductor device includes: preparing a stepped structure being arranged on a substrate, the stepped structure including a first region and a second region, a height of the stepped structure of the second region being lower than a height of the stepped structure of the first region; and etching the first region and the second region of the stepped structure by irradiating the first region and the second region with an ion beam, an irradiation amount of the ion beam irradiating the first region is larger than an irradiation amount of the ion beam irradiating the second region.

4 Claims, 18 Drawing Sheets

METHOD OF MANUFACTURING SEMICONDUCTOR DEVICE AND ION BEAM IRRADIATION APPARATUS

CROSS REFERENCE TO RELATED APPLICATION(S)

This application is based upon and claims the benefit of priority from the prior Japanese Patent Application No. 2021-047982, filed on Mar. 22, 2021, the entire contents of which are incorporated herein by reference.

FIELD

Embodiments described herein relate generally to a method of manufacturing a semiconductor device and an ion beam irradiation apparatus.

BACKGROUND

The semiconductor package using a NAND flash memory as a semiconductor device is known. In order to increase the capacity of such NAND flash memory, a three-dimensional NAND flash memory having a configuration that a large number of memory cells are stacked has been put into practical use. A plurality of conductive layers connected to each memory cell is stacked on a substrate and connected to a driving circuit or the like.

DETAILED DESCRIPTION

Figure 1:
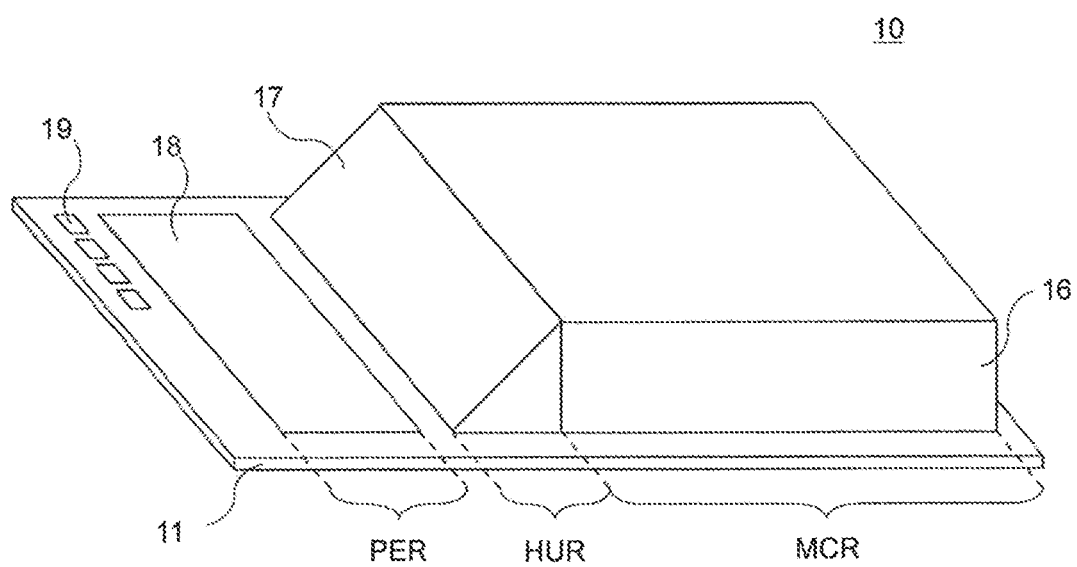
FIG. 1 is a perspective view showing an entire configuration of a semiconductor device according to an embodiment.

A method of manufacturing a semiconductor device according to the present embodiment includes: preparing a stepped structure being arranged on a substrate, the stepped structure including a first region and a second region, a height of the stepped structure of the second region being lower than a height of the stepped structure of the first region; and etching the first region and the second region of the stepped structure by irradiating the first region and the second region with an ion beam; an irradiation amount of the ion beam irradiating the first region is larger than an irradiation amount of the ion beam irradiating the second region.

Hereinafter, the method of manufacturing a semiconductor device and an ion beam irradiation apparatus according to the present embodiment will be described in detail with reference to the drawings. In the following description, components having substantially the same functions and configurations are denoted by the same reference numerals or with the same reference numerals followed by the addition of an alphabet, and will be described in duplicate only when necessary. Each of the embodiments described below exemplifies a device and a method for embodying a technical idea of this embodiment. The technical idea of the embodiment is not specified as materials, shapes, structures, arrangements, and the like of the parts described below. Various modifications may be made to the technical idea of the embodiment in addition to the scope of the claims.

For the sake of clarity of description, the drawings may be schematically represented with respect to widths, thicknesses, shapes, and the like of the respective portions compared with actual embodiments, but are merely an example and do not limit the interpretation of the present invention. In this specification and each drawing, elements having the same functions as those described with reference to the preceding drawings are denoted by the same reference numerals, and a repetitive description thereof may be omitted.

A plurality of films formed by the same process has the same layer structure and is made of the same material. In this specification, even when a plurality of films has different functions or roles, the plurality of films formed by the same process is treated as films existing in the same layer.

In the embodiments of the present disclosure, the direction from a substrate to a memory cell is referred to as an upward direction. On the contrary, the direction from the memory cell to the substrate is referred to as a downward direction. As described above, for convenience of explanation, the phrase "upward" or "downward" is used for explanation, but, for example, the substrate and the memory cell may be arranged so that the vertical relationship is opposed to that shown in the drawings. In the following explanation, for example, the expression "a memory cell on a substrate" merely describes the vertical relationship between the substrate and the memory cell as described above, and other members may be arranged between the substrate and the memory cell.

The expressions "α includes A, B or C," "α includes any of A, B and C," "α includes one selected from the group consisting of A, B and C," and the like do not exclude the case where α includes multiple combinations of A to C unless otherwise specified. Furthermore, these expressions do not exclude the case where a includes other elements.

The following embodiments may be combined with each other as long as there is no technical contradiction.

In the following embodiments, a memory cell array is described as an example of a semiconductor device, but the disclosed techniques can be applied to a semiconductor device other than a memory cell array (e.g., CPUs, display units, interposers, etc.).

First Embodiment

[Entire Configuration of Semiconductor Device]

An entire configuration of a semiconductor device according to the present embodiment will be described with reference to FIG. 1. FIG. 1 is a perspective view showing an arrangement of each element of a semiconductor device 10 according to the present embodiment.

The semiconductor device 10 is a NAND flash memory device and includes memory cells arranged in three dimensions, Specifically, a source-side select gate transistor, a large number (e.g., 64) of memory cell transistors, and a drain-side select gate transistor are connected in series in a direction perpendicular to a surface of a semiconductor substrate 11 to constitute a memory string. A dummy cell transistor may be included at both ends of a large number of memory cell transistors connected in series, or between a part of a large number of memory cell transistors.

The semiconductor device 10 is formed on the semiconductor substrate 11. A memory cells region MCR and a drawn region HUR are partitioned on the semiconductor substrate 11. A memory cell array 16 including a plurality of memory cells stacked in three dimensions is formed in the memory cells region MCR. The memory cell array 16 includes a stacked body in which a plurality of conductive layers and a plurality of insulating layers are alternately stacked. This plurality of conductive layers functions as a source-side select gate line, word lines, and a drain-side select gate line connected to each transistor in the memory string. The plurality of conductive layers and the plurality of insulating layers extend to the drawn region HUR to form a stacked wiring structure 17. Bit lines (not shown) are provided on the memory cell array 16 and connected to a peripheral circuit 18, Wirings (not shown) are provided on the stacked wiring structure 17 and connected to the peripheral circuit 18.

A peripheral circuit region PER is further partitioned on the semiconductor substrate 11. The peripheral circuit 18 is formed in the peripheral circuit region PER. The peripheral circuit 18 includes a large number of CMOS transistors. The peripheral circuit 18 includes a column-based circuit and the like including a driving circuit configured to drive each word line connected to the memory cell, a decoder circuit configured to select each word line, a sense amplifier configured to sense a bit line potential at the time of reading, and a bit line potential control circuit configured to supply a voltage to the bit line at the time of writing. Wirings of the peripheral circuit region PER are omitted in FIG. 1. The semiconductor substrate 11 has a pad row 19 for exchanging signals to the outside of the chip and receiving a power supply.

[Configuration of Memory Cells Region MCR and Drawn Region HUR]

Figure 2:
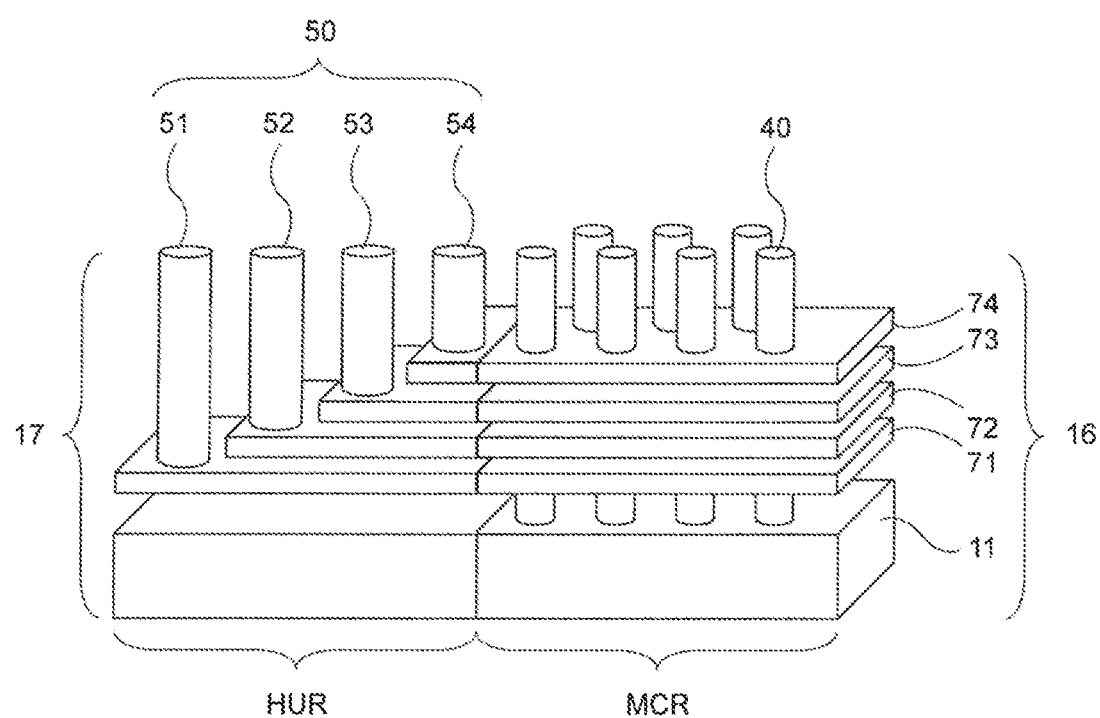
FIG. 2 is a perspective view showing a configuration of a memory cells region MCR and a drawn region HUR of a semiconductor device according to an embodiment.

FIG. 2 is a perspective view showing a configuration of the memory cells region MCR and the drawn region HUR of the semiconductor device according to the present embodiment. In order to prevent the figure from being confused, a member having conductivity is shown, and hatchings in the drawing are omitted. The portion where the member is not shown in FIG. 2 is insulated using an insulating material such as silicon dioxide.

In the memory cells region MCR, the memory cell array 16 is formed on the semiconductor substrate 11 containing a silicon single crystal. The memory cell array 16 includes an insulating layer, a conductive layer 71, an insulating layer, a conductive layer 72, an insulating layer, a conductive layer 73, an insulating layer, and a conductive layer 74 that extend parallel to the surface of the semiconductor substrate 11. The memory cell array 16 includes a stacked body in which the plurality of insulating layers and the plurality of conductive layers are alternately stacked. Although only four conductive layers are shown in the figure, a larger number of conductive layers such as 33 layers, 65 layers are stacked. These conductive layers correspond to the source-side select gate line, the word lines, or the drain-side select gate line connected to the transistors.

Memory pillars 40 that penetrate the plurality of insulating layers and the plurality of conductive layers are formed in the memory cells region MCR. The memory pillar 40 has a cylindrical shape, and from the outer peripheral side toward the center side, a block insulating film containing a silicon dioxide film, a charge storage film containing a silicon nitride film, a tunnel insulating film containing a silicon dioxide film, a semiconductor channel containing an amorphous or polycrystalline silicon film, and a silicon dioxide film are stacked. The portion surrounded by the conductive layers 71, 72, 73, and 74 (corresponding to the select gate lines or word lines) functions as a part of a non-volatile memory cell that traps the carrier in the silicon nitride film.

In the drawn region HUR, the stacked wiring structure 17 is formed on the semiconductor substrate 11 containing the silicon single crystal. The plurality of insulating layers and the plurality of conductive layers extending from the memory cells region MCR are also formed in the drawn region HUR. The stacked wiring structure 17 includes the insulating layer, the conductive layer 71, the insulating layer, the conductive layer 72, the insulating layer, the conductive layer 73, the insulating layer, the conductive layer 74, and the insulating layer that extend parallel to the surface of semiconductor substrate 11. The stacked wiring structure 17 includes the stacked body in which the plurality of insulating layers and the plurality of conductive layers are alternately stacked. Although only four conductive layers are shown in the figure, it is as described above that a larger number of conductive layers such as 33 layers, 65 layers are stacked. These conductive layers correspond to the wirings drawn from the word lines, the source-side select gate line, or the drain-side select gate line in the drawn region HUR.

In the drawn region HUR, the plurality of conductive layers 71, 72, 73, and 74 (corresponding to the wirings drawn from the select gate lines or word lines) are formed in a staircase structure to expose a part of the lower conductive layer. The conductive layers 71, 72, 73, and 74 are connected to corresponding contact plugs 51, 52, 53, and 54 (when not distinguishing the contact plugs 51, 52, 53, and 54, referred to as the contact plugs 50) in the region exposed in the staircase structure, respectively. Each contact plug 50 is drawn over the stacked wiring structure 17 via a contact hole penetrating an insulating body (not shown).

The contact plug 50 has a larger diameter and a larger cross-sectional area than the memory pillar 40. The contact plug 50 has a smaller arrangement density than the memory pillar 40. In other words, the contact plug 50 does not need to be arranged at a high density in a small region as the memory pillar 40.

[Configuration of the Stacked Wiring Structure]

Figure 3A:
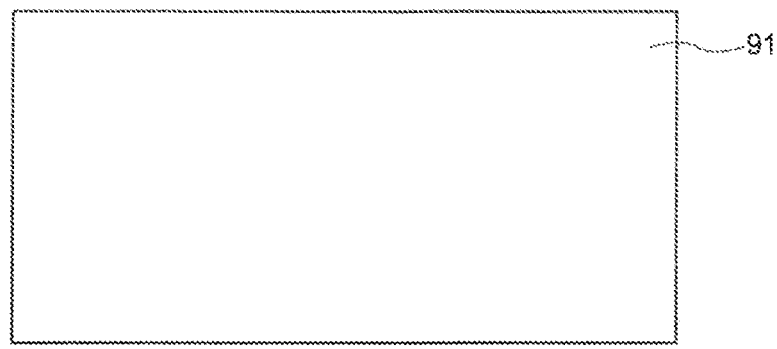
FIG. 3A is a top view showing a configuration of a stacked wiring structure according to an embodiment.
Figure 3B:
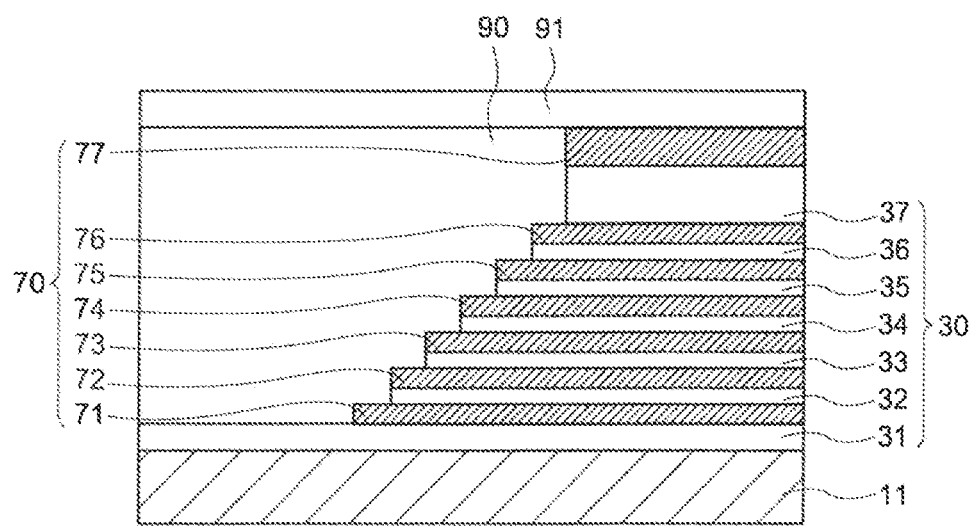
FIG. 3B is a cross-sectional view showing a configuration of a stacked wiring structure according to an embodiment.

FIG. 3A is a top view showing a configuration of the stacked wiring structure 17, and FIG. 3B is a cross-sectional view showing a configuration of the stacked wiring structure 17. The stacked wiring structure 17 has the plurality of conductive layers 71, 72, 73, 74, 75, 76, and 77 stacked on the semiconductor substrate 11 (when not distinguishing the plurality of conductive layers 71 to 77, referred to as the conductive layers 70). The plurality of conductive layers 71, 72, 73, 74, 75, 76, and 77, and a plurality of insulating layers 31, 32, 33, 34, 35, 36, and 37 (when not distinguishing the plurality of insulating layers 31 to 37, referred to as the insulating layers 30) are periodically stacked in a direction perpendicular to the main surface of the semiconductor substrate 11 (stacking direction). Although only seven conductive layers are shown in the figure, it is as described above that a larger number of layers such as 33 layers, 65 layers are stacked. Each conductive layer 70 is a single layer. That is, when observing the cross-sectional shape for one conductive layer 70, a single material may be continuous in a film thickness direction (Z-direction) of the conductive layer 70. Also, there is no need to be an interface within one conductive layer 70. The conductive layer 70 may be tungsten, for example.

The insulating layer 30 is formed between the conductive layers 70 adjacent in the stacking direction. The insulating layer 31 is also formed between the semiconductor substrate 11 and the lowermost layer of the conductive layer 71. The conductive layers 70 adjacent to each other in the stacking direction are insulated from each other, and the material of the insulating layer 30 may contain silicon and oxygen, for example, silicon oxide such as silicon dioxide ($SiO_2$), TEOS (Tetra Ethyl Ortho Silicate). The insulating layer 30 is deposited, for example, using a CVD (Chemical Vapor Deposition) apparatus.

The plurality of conductive layers 70 and the plurality of insulating layers 30 are formed in a staircase structure to expose a part of the lower conductive layer 70, respectively. An insulating body 90 to embed the staircase structure is formed on the staircase structure of the stacked body. The material of the insulating body 90 may contain silicon and oxygen, for example, silicon oxide such as silicon dioxide ($SiO_2$), TEOS (Tetra Ethyl Ortho Silicate), or the like.

Although not shown in FIG. 3A and FIG. 3B, a plurality of contact holes CH is formed in the insulating body 90. The contact hole CH is formed up to the corresponding conductive layer 70 by penetrating the insulating body 90. The contact hole CH exposes the corresponding conductive layer 70 in the staircase structure to the bottom. That is, the depth of each of the contact holes from the upper surface of the semiconductor device to the corresponding conductive layer 70 is different, respectively.

The contact plug 50 is formed in the contact hole CH. The contact plug 50 is connected to the conductive layer 70 at the bottom of the contact hole CH. That is, the length of the contact plug 50 from the upper surface of the stacked wiring structure 17 to the corresponding conductive layer 70 is different, respectively. Each of the contact plugs 50 has a cylindrical shape, and the material f the contact plug 50 may be, for example, a metal such as tungsten.

[Method of Manufacturing Stacked Wiring Structure]

Referring to FIG. 4A to FIG. 8B, a method of manufacturing the stacked wiring structure 17 according to the present embodiment will be described.

Figure 4A:
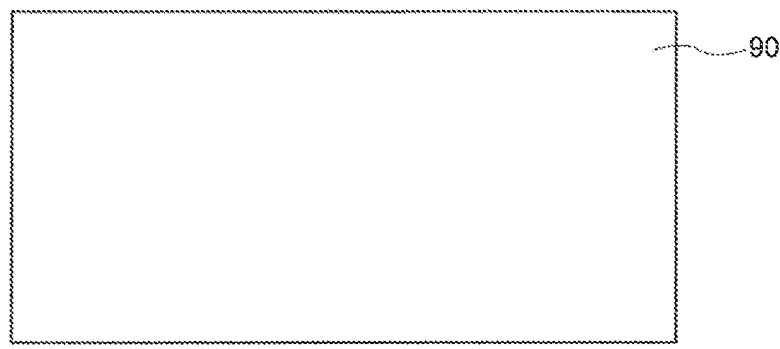
FIG. 4A is a top view showing a method of manufacturing a stacked wiring structure according to an embodiment.
Figure 4B:
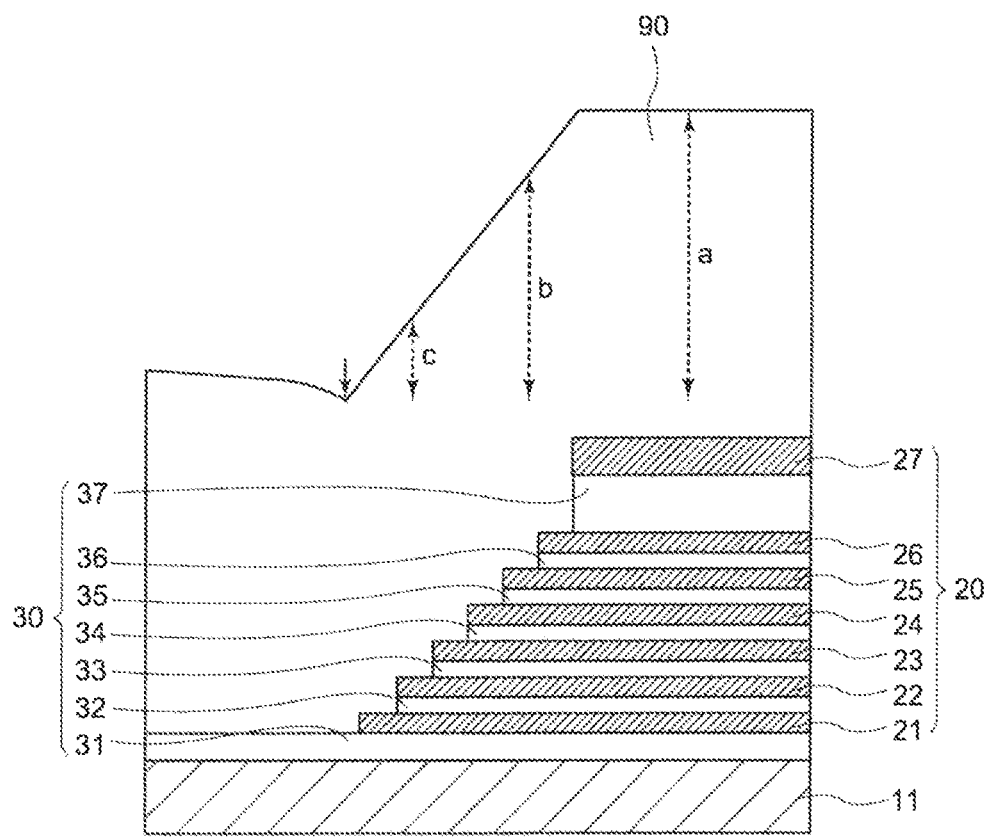
FIG. 4B is a cross-sectional view showing a method of manufacturing a stacked wiring structure according to an embodiment.

First, as shown in FIGS. 4A and 4B, the insulating layer 31 (TEOS film), a sacrificial layer 21 (SiN film), the insulating layer 32 (TEOS film), a sacrificial layer 22 (SiN film), the insulating layer 33 (TEOS film), a sacrificial layer 23 (SiN film), the insulating layer 34 (TEOS film), a sacrificial layer 24 (SiN film), the insulating layer 35 (TEOS film), a sacrificial layer 25 (SiN film), the insulating layer 36 (TEOS film), a sacrificial layer 26 (SiN film), the insulating layer 37 (TEOS film), and a sacrificial layer 27 (SiN film) are sequentially formed on the semiconductor substrate 11 to form a stacked body. These insulating layers 31, 32, 33, 34, 35, 36, and 37 (TEOS films) and the sacrificial layers 21, 22, 23, 24, 25, 26, and 27 (SiN films, when not distinguishing the sacrificial layers 21, 22, 23, 24, 25, 26, and 27, referred to as the sacrificial layers 20) are deposited, for example, using the CVD apparatus. The alternately stacked insulating layer 30 and the sacrificial layer 20 are formed in contact with each other. The plurality of sacrificial layers 20 and the plurality of insulating layers 30 are formed in a staircase structure to expose a part of the lower sacrificial layer 20, respectively. In the present embodiment, the material of the insulating layer 30 is exemplified by the TEOS film, but the material of the insulating layer 30 is not limited to this, and may be, for example, silicon dioxide ($SiO_2$), In the present embodiment, the material of the sacrifice layer 20 is exemplified by the silicon nitride film (SiN), but the material of the sacrifice layer 20 is not limited to this, and may be, for example, silicon or a metal such as tungsten.

The insulating body 90 to embed the staircase structure of the stacked body is formed on the stacked body to form the stepped structure. Since the insulating body 90 has a substantially uniform thickness, the upper surface of the insulating body 90 reflects a large step of the staircase structure. That is, the upper surface of the stepped structure (the upper surface of the insulating body 90) has a large step from the upper surface of the insulating layer 31 to the upper surface of the sacrificial layer 27. In FIG. 4B, small steps of the staircase structure of each layer are moderated, and a slope connecting the large steps is formed on the upper surface of the insulating body 90. However, the present invention is not limited to this, and the upper surface of the insulating body 90 may reflect at least a part of the small steps of the staircase structure of each layer. The insulating body 90 is formed such that the lowest portion (arrow) of the upper surface of the insulating body 90 is higher than the upper surface of the sacrificial layer 27, That is, the insulating body 90 is formed thicker than the large steps of the staircase structure (from the upper surface of the insulating layer 31 to the upper surface of the sacrificial layer 27). The insulating body 90 is deposited using, for example, the CVD apparatus. The material of the insulating body 90 may contain silicon and oxygen, for example, silicon oxide such as silicon dioxide ($SiO_2$), TEOS (Tetra Ethyl Ortho Silicate), or the like.

The surface shape of the stepped structure (surface shape of the insulating body 90) having steps is measured by an atomic force microscope (AFM) or the like. A three-dimensional map on the substrate is created by measuring the surface shape of the stepped structure on the substrate. The step information of the upper surface of the insulating body 90 can be obtained from the three-dimensional map on the substrate. Based on the step information of the upper surface of the insulating body 90, the surface of the stepped structure is partitioned into a plurality of regions (regions A to C) to be described later according to the height from the semiconductor substrate 11 to the upper surface of the insulating body 90.

Figure 5A:
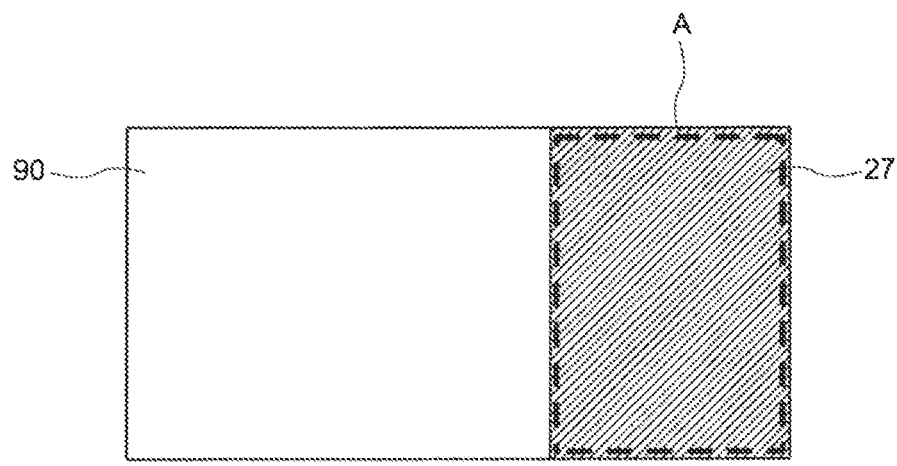
FIG. 5A is a top view showing a method of manufacturing a stacked wiring structure according to an embodiment.

As shown in FIGS. 5A to 7B, the step of the stepped structure (step of the insulating body 90) is planarized by etching by irradiating a specific region with an ion beam using an ion beam irradiation apparatus to be described later. First, as shown in FIG. 5A and FIG. 5B, the insulating body 90 of the stepped structure in a region A (above the sacrificial layer 27) in which the height from the semiconductor substrate 11 to the upper surface of the insulating body 90 is highest is etched by irradiating the region A with the ion beam. In case that the insulating body 90 contains silicon and oxygen, the ion species contained in the ion beam is preferably CxFy$^+$ ion containing no H. The CxFy$^+$ ion may be, for example, $C_3F_5^+$ ion, or $C_4F_6^+$ ion. By irradiating the ion beam containing such ion species, the insulating body 90 can be etched. Also, in a case that the sacrificial layer 27 contains silicon nitride, silicon, or tungsten, the sacrificial layer 27 serves as an etching stopper, and the insulating body 90 can be selectively etched.

Figure 5B:
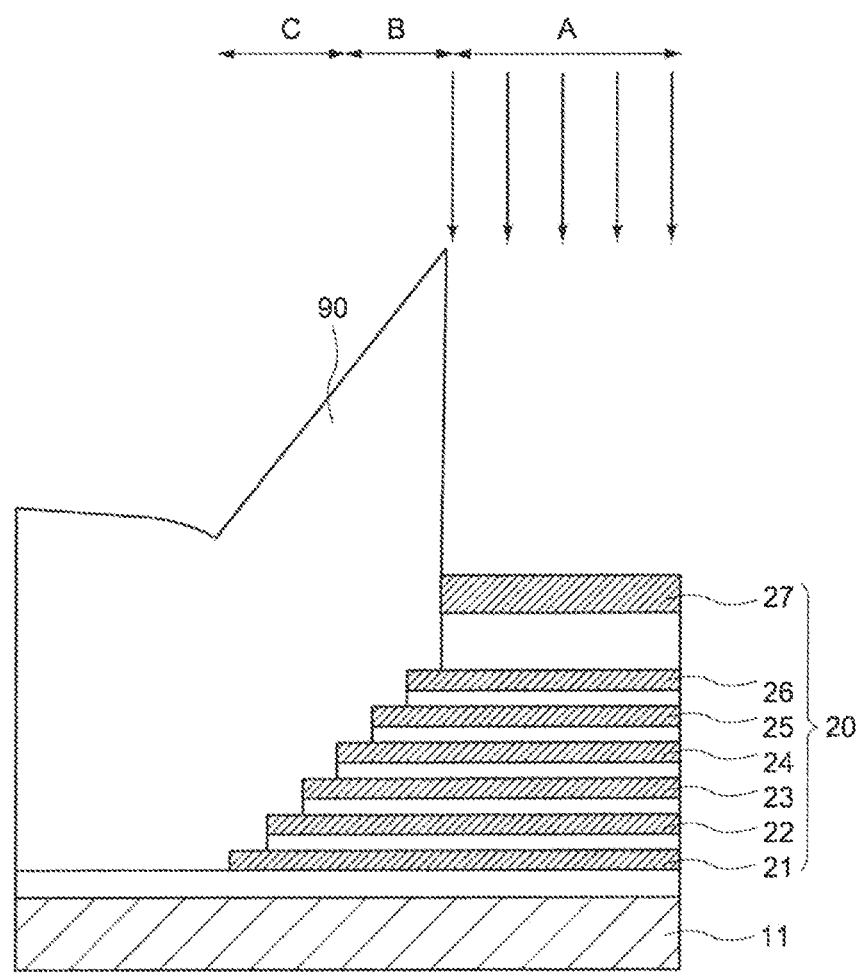
FIG. 5B is a cross-sectional view showing a method of manufacturing a stacked wiring structure according to an embodiment.

The irradiation amount of the ion beam irradiating the region A can be appropriately adjusted according to the height (a) from the lowest portion of the upper surface of the insulating body 90 (arrow) to the upper surface of the insulating body 90. The irradiation amount of the ion beam can be controlled by the scanning speed, the number of scans, and the density of the ion beam. The irradiation amount of the ion beam is preferably controlled by the scanning speed and the number of scans of the ion beam. In FIGS. 5A and 5B, the insulating body 90 was etched up to the upper surface of the sacrificial layer 27. However, the present invention is not limited to this, and a part of the insulating body 90 may remain. The insulating body 90 may be etched up to between the lowest portion of the upper surface of the insulating body 90 to the upper surface of the sacrificial layer 27.

Figure 6A:
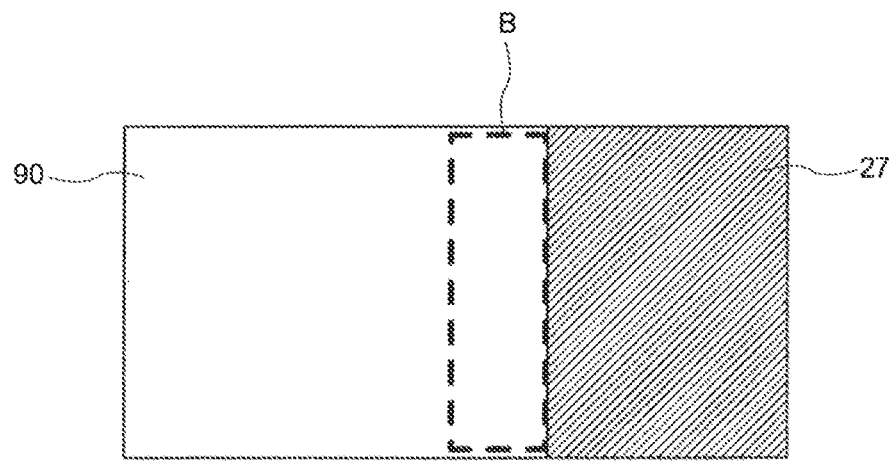
FIG. 6A is a top view showing a method of manufacturing a stacked wiring structure according to an embodiment.
Figure 6B:
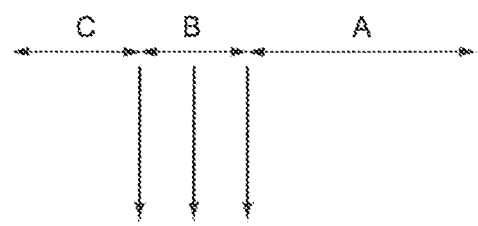
FIG. 6B is a cross-sectional view showing a method of manufacturing a stacked wiring structure according to an embodiment.
Figure 6B:
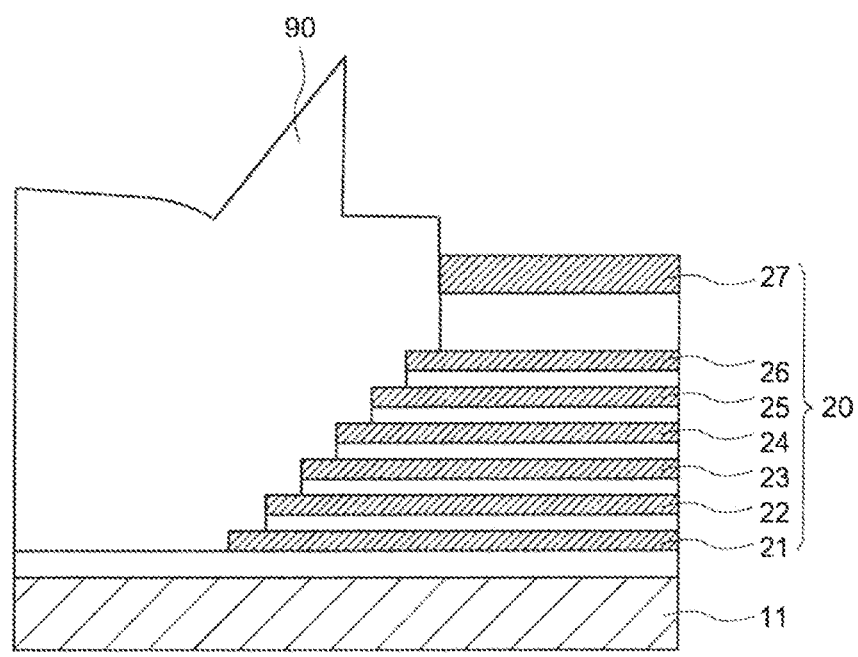

As shown in FIGS. 6A and 6B, the insulating body 90 of the stepped structure in a region B (above the upper half of the staircase structure) in which the height from the semiconductor substrate 11 to the upper surface of the insulating body 90 is the next-highest after the region A is etched by irradiating the region B with an ion beam. The region B has a lower height from the semiconductor substrate 11 to the upper surface of the insulating body 90 than the region A and does not include the region A.

The irradiation amount of the ion beam irradiating the region B can be appropriately adjusted according to the height (b) from the lowest portion of the upper surface of the insulating body 90 (arrow) to the upper surface of the insulating body 90. The irradiation amount of the ion beam irradiating the region B is smaller than the irradiation amount of the ion beam irradiating the region A. The scanning speed of the ion beam irradiating the region B may be larger than the scanning speed of the ion beam irradiating the region A. The number of scans of the ion beam irradiating the region B may be smaller than the number of scans of the ion beam irradiating the region A. The density of the ion beam irradiating the region B may be smaller than the the density of the ion beam irradiating the region A. In FIG. 6A and FIG. 6B, the insulating body 90 was etched up to the lowest portion of the upper surface of the insulating body 90. However, the present invention is not limited to this, and the insulating body 90 may be etched up to between the lowest portion of the upper surface of the insulating body 90 to the upper surface of the sacrificial layer 27.

Figure 7A:
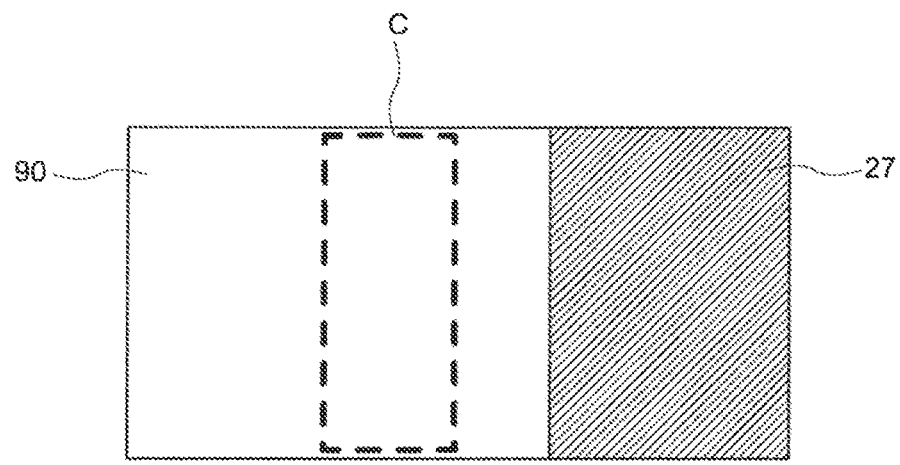
FIG. 7A is a top view showing a method of manufacturing a stacked wiring structure according to an embodiment.
Figure 7B:
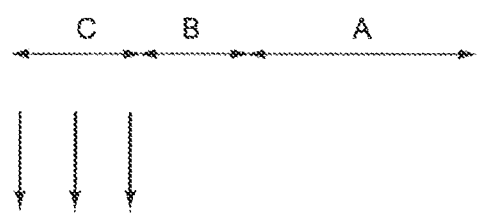
FIG. 7B is a cross-sectional view showing a method of manufacturing a stacked wiring structure according to an embodiment.
Figure 7B:
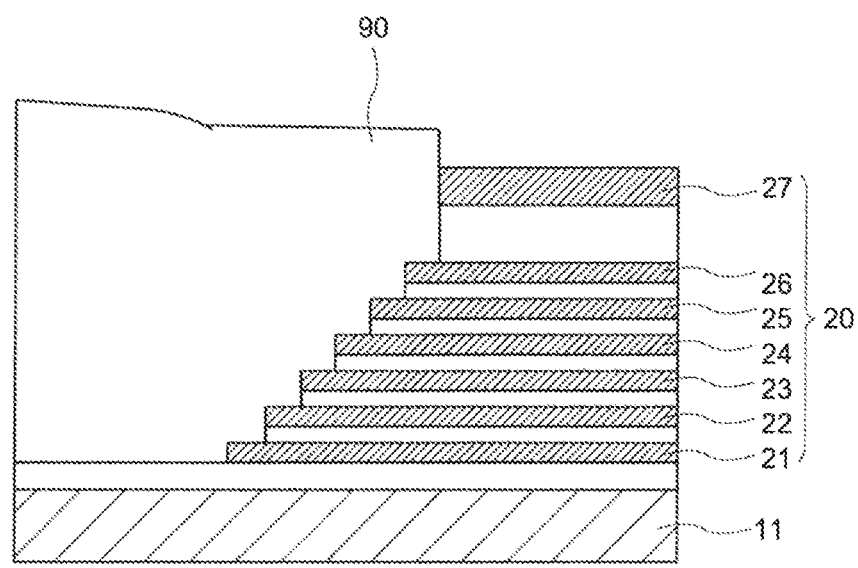

As shown in FIGS. 7A and 7B, the insulating body 90 of the stepped structure in a region C (above the lower half of the staircase structure) in which the height from the semiconductor substrate 11 to the upper surface of the insulating body 90 is the next-highest after the region B is etched by irradiating the region C with the ion beam. The region C has a lower height from the semiconductor substrate 11 to the upper surface of the insulating body 90 than the region B and does not include the regions A and B.

The irradiation amount of the ion beam irradiating the region C can be appropriately adjusted according to the height (c) from the lowest portion of the upper surface of the insulating body 90 (arrow) to the upper surface of the insulating body 90. The irradiation amount of the ion beam irradiating the region C is smaller than the irradiation amount of the ion beam irradiating region B. The scanning speed of the ion beam irradiating the region C may be larger than the scanning speed of the ion beam irradiating the region B. The number of scans of the ion beam irradiating the region C may be smaller than the number of scans of the ion beam irradiating the region B. The density of the ion beam irradiating the region C may be smaller than the density of the ion beam irradiating the region B. In FIG. 7A and FIG. 7B the insulating body 90 was etched up to the lowest portion of the upper surface of the insulating body 90, However, the present invention is not limited to this, and the insulating body 90 may be etched up to between the lowest portion of the upper surface of the insulating body 90 to the upper surface of the sacrificial layer 27.

In the present embodiment, a method of easily planarizing the stepped structure has been shown by dividing the stepped structure having large steps into three different regions (the regions A to C) according to the height from the semiconductor substrate 11 to the upper surface of the stepped structure and etching them. However, the present invention is not limited to this, and finer adjustment is possible by further subdividing the region according to the height from the semiconductor substrate 11 to the upper surface of the stepped structure. In the present embodiment, the method of substantially planarizing the stepped structure has been shown by etching the stepped structure in the order from the region A where the height from the semiconductor substrate 11 to the upper surface of the stepped structure is high to the region C where the height from the semiconductor substrate 11 to the upper surface of the stepped structure is low. However, the present invention is not limited to this, the stepped structure may be etched in the order from the region C where the height from the semiconductor substrate 11 to the upper surface of the stepped structure is low to the region A where the height from the semiconductor substrate 11 to the upper surface of the stepped structure is high.

As described above, the method of manufacturing the semiconductor device according to the present embodiment can substantially planarized the stepped structure having large steps by etching by irradiating a specific region with an ion beam of a specific irradiation amount, thereby improving the manufacturing efficiency of the semiconductor device.

Figure 8A:
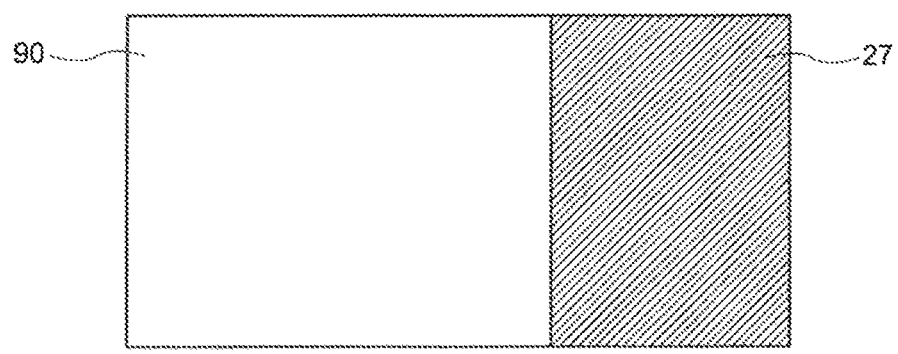
FIG. 8A is a top view showing a method of manufacturing a stacked wiring structure according to an embodiment.
Figure 8B:
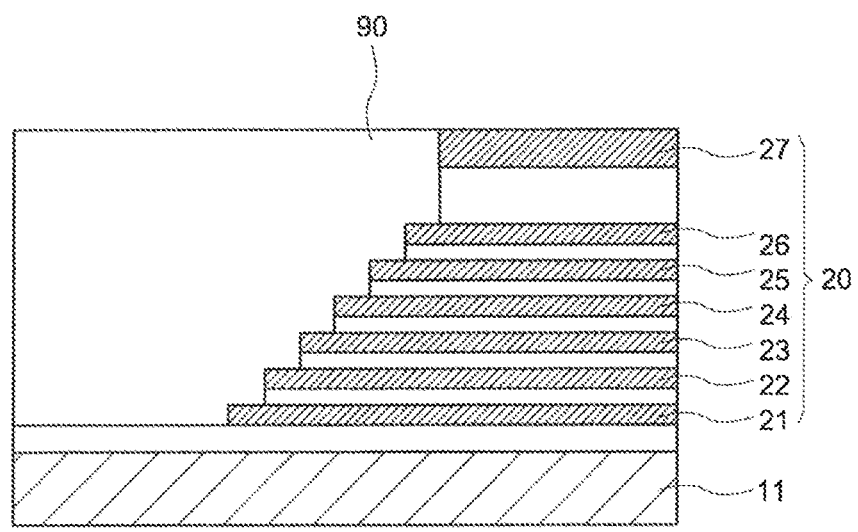
FIG. 8B is a cross-sectional view showing a method of manufacturing a stacked wiring structure according to an embodiment.

As shown in FIGS. 8A and 8B, the upper surface of the insulating body 90 may be further planarized by polishing up to the upper surface of the sacrificial layer 27 by chemical mechanical polishing (CMP).

An insulating film 91 is formed on the insulating body 90 and the sacrificial layer 27. Further, a slit (not shown) is dug down in a predetermined region of the stacked body, and the sacrificial layer 20 contained in the stacked body is collectively removed from the slit. As a result, a cavity is formed in the portion where the sacrificial layer 20 was present. Then, by embedding a metal such as tungsten in the cavity, the conductive layer 70 shown in FIG. 3B is formed.

As described above, the method of manufacturing the semiconductor device according to the present embodiment can easily planarized the stepped structure having large steps by etching by irradiating a specific region with an ion beam of a specific irradiation amount. The method of manufacturing the semiconductor device according to the present embodiment does not need to perform a plurality of steps by wet etching, and improves the manufacturing efficiency of the semiconductor device.

[Configuration of an Ion Beam Irradiation Apparatus]

Figure 9:
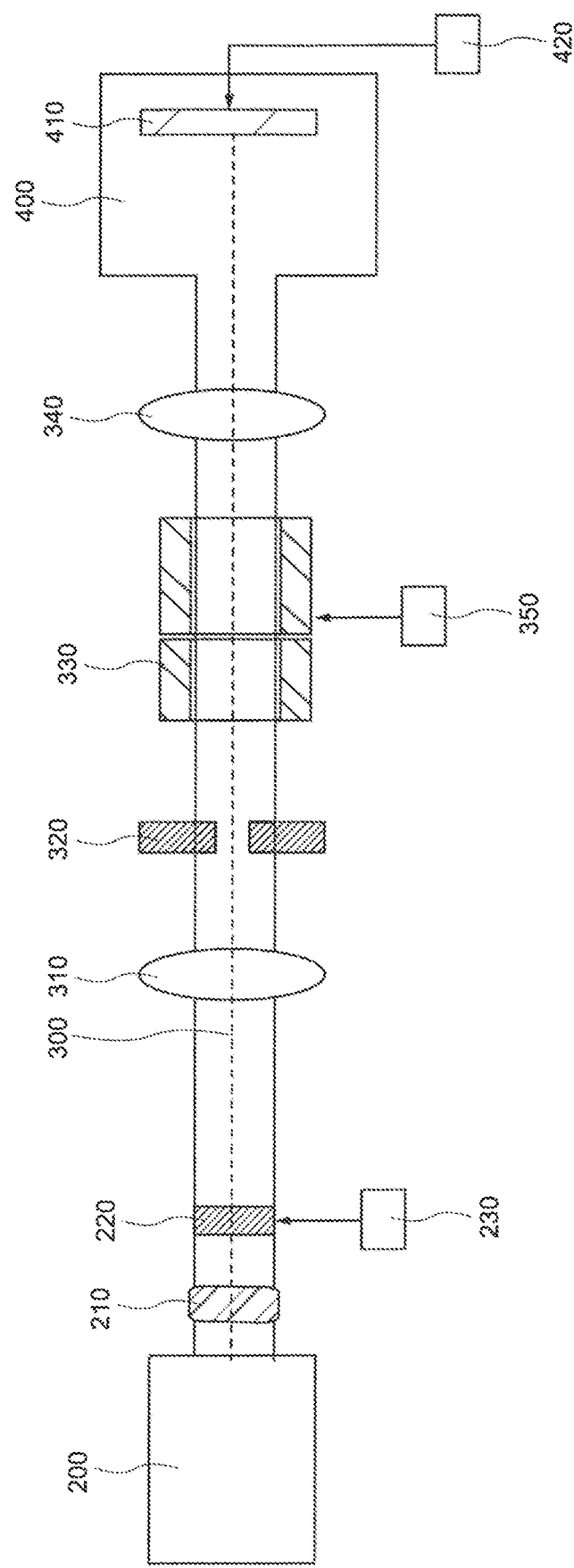
FIG. 9 is a schematic diagram showing a configuration of an ion beam irradiation apparatus according to an embodiment.

FIG. 9 is a schematic diagram showing a configuration of an ion beam irradiation apparatus. An ion beam irradiation apparatus 100 shown in FIG. 9 is an ECR (Electron Cyclotron Resonance) plasma type, and includes a plasma generation chamber 200, a beam line 300, and a beam irradiation chamber 400.

The plasma generation chamber 200 generates plasma by generating a magnetic field in a vacuum chamber and introducing microwaves. When a gas is introduced in a state where plasma is generated and a predetermined acceleration voltage is applied to an acceleration electrode, an ion beam is generated. The plasma generation chamber 200 may, for example, generate the ion beam containing $C_3F_5^+$ ion or $C_4F_6^+$ ion for etching the insulating body 90 using $C_4F_6$ gas and $O_2$ gas. The ion energy at this time is preferably, for example, 1000 eV or more. The plasma generation chamber 200 may control the density of the ion beam.

The ion beam generated in the plasma generation chamber 200 reaches the beam line 300 via a mass selector 210 and a shutter 220. The mass selector 210 separates and draws out target ions. For example, after generating CF-based plasma containing a carbon element and a fluorine element in the vacuum chamber, $C_3F_5^+$ ion or $C_4F_6^+$ ion can be extracted by the mass selector 210. The shutter 220 is, for example, a Faraday cup, and shields the ion beam. The shutter control unit 230 controls the opening and closing of the shutter 220.

The beam line 300 causes the ion beam generated in the plasma generation chamber 200 to reach the beam irradiation chamber 400 via a condenser lens 310, a diaphragm 320, a deflector 330, and an objective lens 340. The spot size of the ion beam can be controlled by focusing the ion beam with the condenser lens 310, the diaphragm 320, and the objective lens 340. The spot size (full width at half maximum) of the ion beam may be, for example, the nanometer order to the micrometer order.

The deflector 330 can scan the ion beam in a fixed order or deflect it to any position. The deflector control unit 350 can control the scanning speed and the number of scans of the ion beam. The deflector control unit 350 controls the scanning speed and the number of scans of the ion beam according to the height from the lowest portion (arrow) of the upper surface of the insulating body 90 to the upper surface of the insulating body 90 based on the step information of the stepped structure obtained from the three-dimensional map of the substrate. By having such a configuration, a specific irradiation region can be irradiated with the ion beam of a specific irradiation amount.

The beam irradiation chamber 400 includes a stage 410 configured to fix the substrate, and a relative position control unit 420 configured to control the relative position of the stage 410 and the ion beam. The relative position control unit 420 can control the irradiation region of the ion beam by moving the stage 410, for example. The relative position control unit 420 partitioned the stepped structure into a plurality of irradiation regions (e.g., the regions A to C described above) according to the height from the semiconductor substrate 11 to the upper surface of the insulating body 90 based on the step information of the stepped structure obtained from the three-dimensional map on the substrate. By having such configuration, it is possible to control the region to irradiate the ion beam.

As described above, the ion beam irradiation apparatus according to the present embodiment can easily planarized the stepped structure having large steps by etching by irradiating a specific region with an ion beam of a specific irradiation amount. The method of manufacturing the semiconductor device according to the present embodiment does not need to perform a plurality of steps by wet etching, and improves the manufacturing efficiency of the semiconductor device.

Modified Example

A configuration of a stacked wiring structure according to the present modified example is the same as the configuration of the stacked wiring structure according to the first embodiment. A method of manufacturing the stacked wiring structure according to the present modified example is the same as the method of manufacturing the stacked wiring structure according to the first embodiment except that the irradiation region of the ion beam. The same description as that of the first embodiment will be omitted, here will be described portions different from the method of manufacturing the stacked wiring structure according to the first embodiment.

[Method of Manufacturing Stacked Wiring Structure]

Referring to FIGS. 10A to 12B, a method of manufacturing the stacked wiring structure 17 according to the present modified example will be described.

First, a stepped structure is formed by the method described in FIGS. 4A and 4B. The surface shape of the stepped structure (surface shape of the insulating body 90) having steps is measured by AFM or the like. A three-dimensional map on the substrate is created by measuring the surface shape of the stepped structure on the substrate. The step information of the upper surface of the insulating body 90 can be obtained from the three-dimensional map on the substrate. Based on the step information of the upper surface of the insulating body 90, the surface of the stepped structure is partitioned into a plurality of regions (regions A' to C') to be described later according to the height from the semiconductor substrate 11 to the upper surface of the insulating body 90.

Figure 10A:
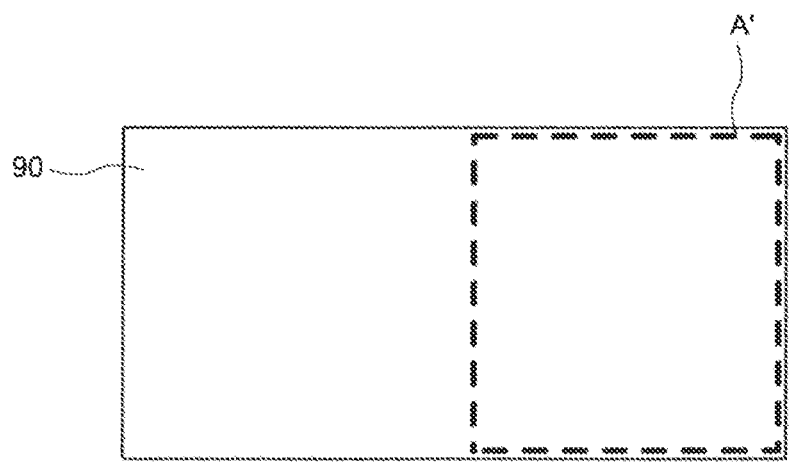
FIG. 10A is a top view showing a method of manufacturing a stacked wiring structure according to an embodiment.

As shown in FIGS. 10A to 12B, the step of the stepped structure (step of the insulating body 90) is planarized by etching by irradiating a specific region with the ion beam using the ion beam irradiation apparatus. First, as shown in FIG. 10A and FIG. 10B, a part of the insulating body 90 of the stepped structure in a region A' where the height from the semiconductor substrate 11 to the upper surface of the insulating body 90 is high is etched by irradiating the region A' with the ion beam.

Figure 10B:
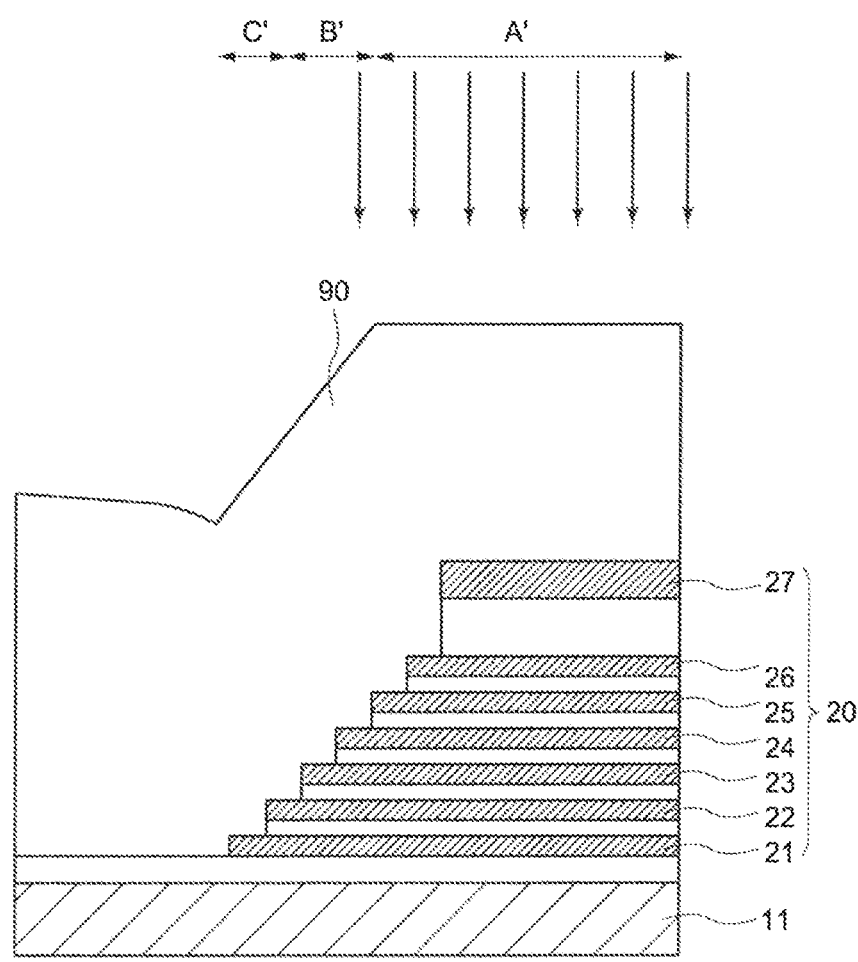
FIG. 10B is a cross-sectional view showing a method of manufacturing a stacked wiring structure according to an embodiment.

The irradiation amount of the ion beam irradiating region A' can be appropriately adjusted according to the height (a) from the lowest portion of the upper surface of the insulating body 90 (arrow) to the upper surface of the insulating body 90. The irradiation amount of the ion beam can be controlled by the scanning speed, the number of scans, and the density of the ion beam. In FIGS. 10A and 10B, the insulating body 90 was etched up to the height (b) of ⅔ of the height (a) from the lowest portion (arrow) of the upper surface of the insulating body 90 to the upper surface of the insulating body 90.

Figure 11A:
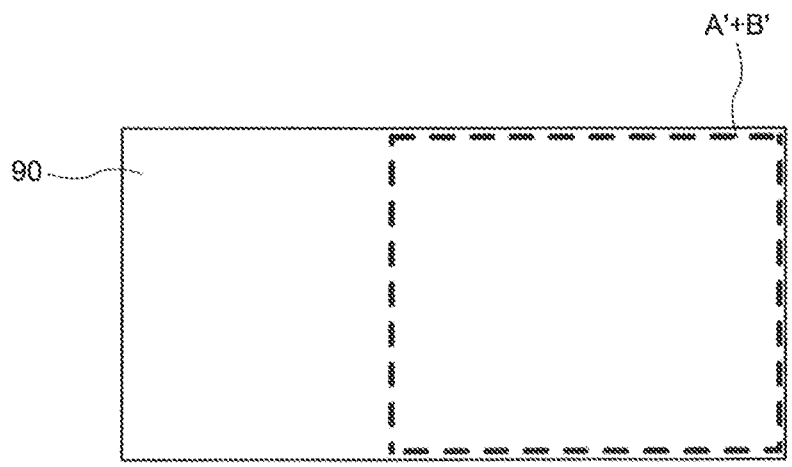
FIG. 11A is a top view showing a method of manufacturing a stacked wiring structure according to an embodiment.
Figure 11B:
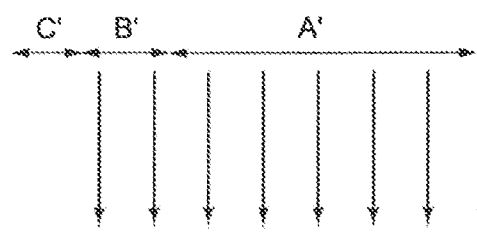
FIG. 11B is a cross-sectional view showing a method of manufacturing a stacked wiring structure according to an embodiment.
Figure 11B:
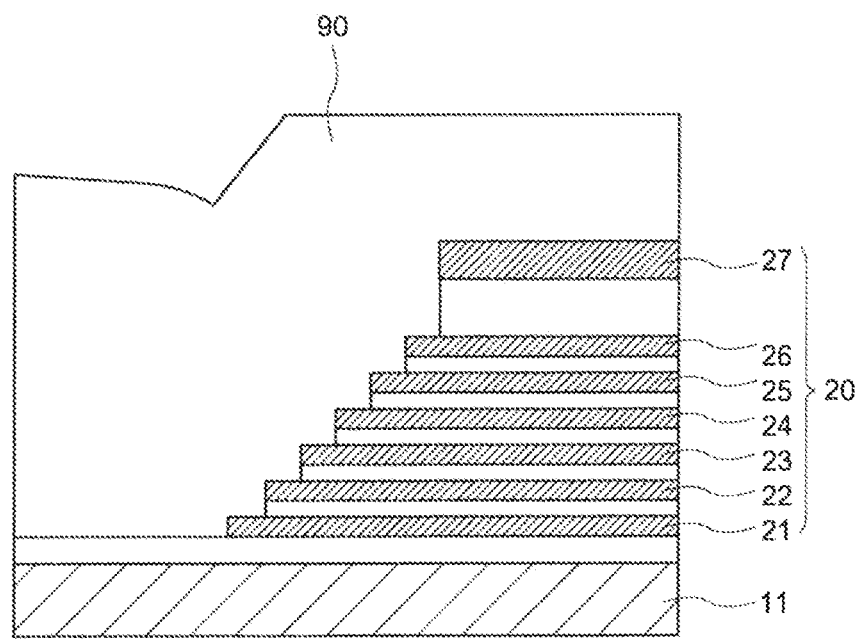

As shown in FIGS. 11A and 11B, a part of the insulating body 90 of the step structure in the region A'+B' is etched by irradiating the region A' and the region B' where the height from the semiconductor substrate 11 to the upper surface of the insulating body 90 is the next-highest after the region A' (region A' B') with the ion beam. The region B' has a lower height from the semiconductor substrate 11 to the upper surface of the insulating body 90 than the region A' and does not include the region A'.

The irradiation amount of the ion beam irradiating the region A'+B' can be appropriately adjusted according to the height (b) from the lowest portion of the upper surface of the insulating body 90 (arrow) to the upper surface of the insulating body 90. The irradiation amount of the ion beam irradiating the region A'+B' is the same as the irradiation amount of the on beam irradiating the region A' in FIGS. 10A and 103. The scanning speed of the ion beam irradiating the region A'+B' may be the same as the scanning speed of the ion beam irradiating the region A' in FIGS. 10A and 10B.

The number of scans of the ion beam irradiating the region A'+B' may be the same as the number of scans of the ion beam irradiating the region A' in FIGS. 10A and 10B. The density of the ion beam irradiating the region A'+B' may be the same as the density of the ion beam irradiating the region A' in FIGS. 10A and 10B. In FIGS. 11A and 11B, the insulating body 90 was etched up to the height (c) of ½ of the height (b) from the lowest portion (arrow) of the upper surface of the insulating body 90 to the upper surface of the insulating body 90.

Figure 12A:
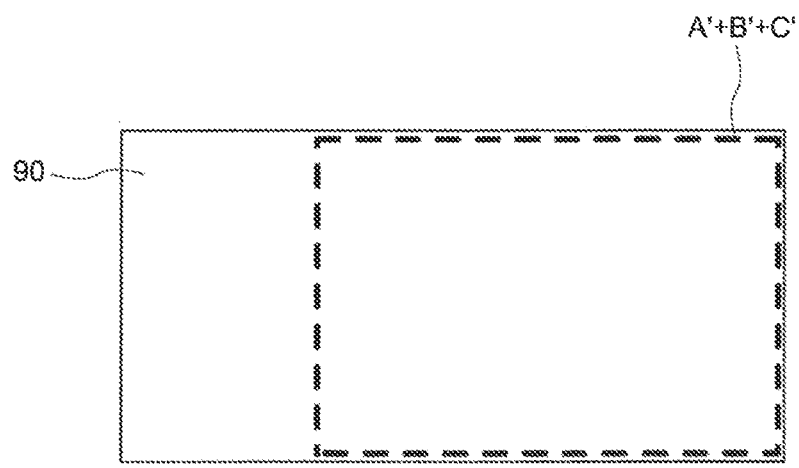
FIG. 12A is a top view showing a method of manufacturing a stacked wiring structure according to an embodiment.
Figure 12B:
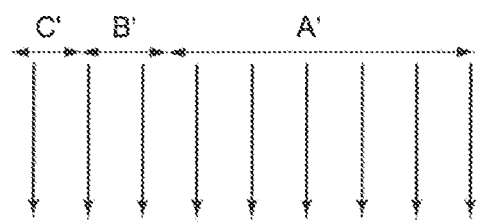
FIG. 12B is a cross-sectional view showing a method of manufacturing a stacked wiring structure according to an embodiment.
Figure 12B:
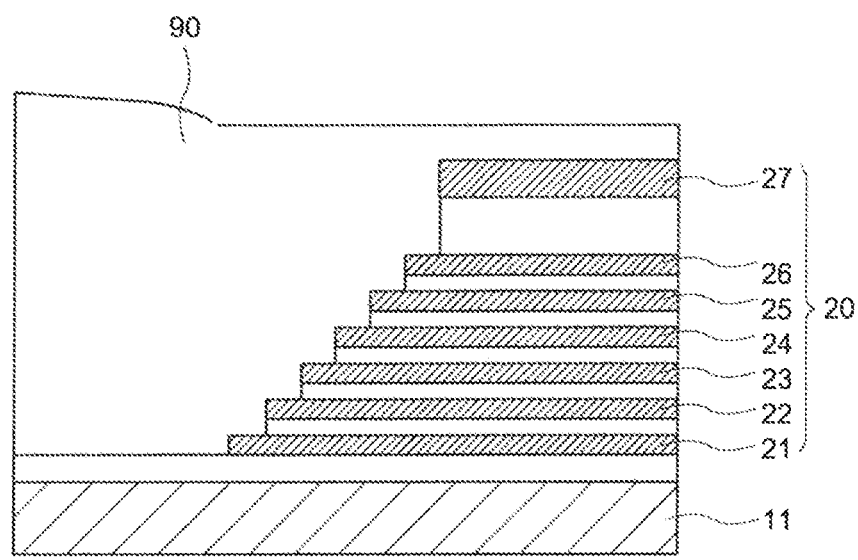

As shown in FIGS. 12A and 12B, a part of the insulating body 90 of the stepped structure in the region A'+B'+C' is etched by irradiating the region A', the region B', and the region C' where the height from the semiconductor substrate 11 to the upper surface of the insulating body 90 is the next-highest after the region B' (region A'+B'+C') with the ion beam. The region C' has a lower height from the semiconductor substrate 11 to the upper surface of the insulating body 90 than the region B' and does not include the regions A' and B'.

The irradiation amount of the ion beam irradiating the region A'+B'+C' can be appropriately adjusted according to the height (c) from the lowest portion of the upper surface of the insulating body 90 (arrow) to the upper surface of the insulating body 90. The irradiation amount of the ion beam irradiating the region A'+B'+C' is the same as the irradiation amount of the ion beam irradiating the region A'+B' in FIGS. 11A and 11B. The scanning speed of the ion beam irradiating the region A'+B'+C' may be the same as the scanning speed of the ion beam irradiating the region A'+B' in FIGS. 11A and 11B, The number of scans of the ion beam irradiating the region A'+B'+C' may be the same as the number of scans of the ion beam irradiating the region A'+B' in FIGS. 11A and 11B. The density of the ion beam irradiating the region A'+B'+C' may be the same as the density of the ion beam irradiating the region A'+B' in FIGS. 11A and 11B. In FIGS. 12A and 12B, the insulating body 90 was etched up to the lowest portion of the upper surface of the insulating body 90. However, the present invention is not limited to this, and the insulating body 90 may be etched up to between the lowest portion of the upper surface of the insulating body 90 to the upper surface of the sacrificial layer 27.

In the present embodiment, a method of easily planarizing the stepped structure has been shown by dividing the stepped structure having large steps into three different regions (the regions A' to C') according to the height from the semiconductor substrate 11 to the upper surface of the stepped structure and repeatedly etching the region where the height from the semiconductor substrate 11 is high. By irradiating the ion beam three times, the irradiation amount of the ion beam irradiating the region A' is larger than the irradiation amount of the ion beam irradiating the region B', and the irradiation amount of the ion beam irradiating the region B' is larger than the irradiation amount of the ion beam irradiating the region C'. The number of scans of the ion beam irradiating the region A' is larger than the number of scans of the ion beam irradiating the region B', and the number of scans of the ion beam irradiating the region B' is larger than the number of scans of the ion beam irradiating the region U.

In the present embodiment, the stepped structure having large steps was divided into three different regions (the regions A' to C') according to the height from the semiconductor substrate 11 to the upper surface of the stepped structure. However, the present invention is not limited to this, and finer adjustment is possible by further subdividing the region according to the height from the semiconductor substrate 11 to the upper surface of the stepped structure. In the present embodiment, the method of substantially planarizing the stepped structure has been shown by etching the stepped structure in the order of the region A' where the height from the semiconductor substrate 11 to the upper surface of the stepped structure is high, the region A'+B', and the region A'+B' C'. However, the present invention is not limited to this, and the stepped structure may be etched in the order of the region A'+B' C', the region A'+B", and the region A'.

As described above, the method of manufacturing the semiconductor device according to the present embodiment can substantially planarized the stepped structure having large steps by etching by irradiating a specific region with an ion beam of a specific irradiation amount, thereby improving the manufacturing efficiency of the semiconductor device.

Next, the stacked wiring structure 17 shown in FIGS. 3A and 3B is formed by the method described in FIGS. 8A and 8B.

Second Embodiment

The configuration of the stacked wiring structure according to the present embodiment is the same as the configuration of the stacked wiring structure according to the first embodiment except that the number of the plurality of conductive layers and the plurality of insulating layers. The method of manufacturing the stacked wiring structure according to the present embodiment is the same as the method of manufacturing the stacked wiring structure according to the first embodiment except that the film is formed by irradiating the ion beam instead of etched by irradiating the ion beam. The same description as that of the first embodiment will be omitted, here will be described portions different from the method of manufacturing the stacked wiring structure according to the first embodiment,
[Configuration of Stacked Wiring Structure]

Figure 13A:
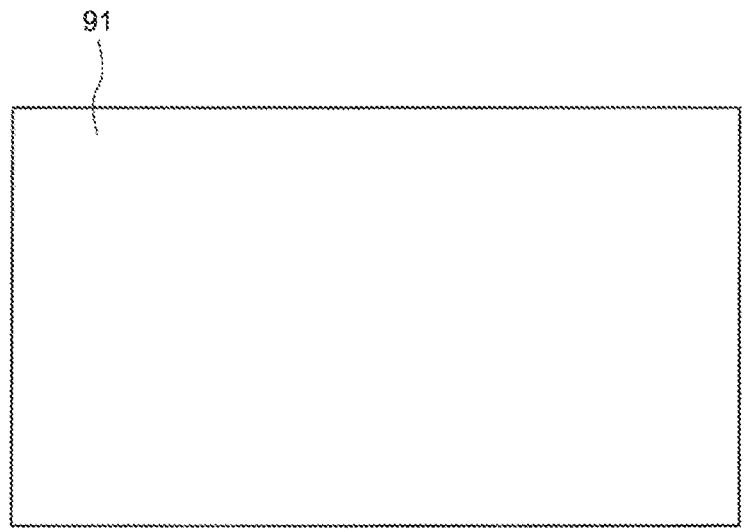
FIG. 13A is a top view showing a configuration of a stacked wiring structure according to an embodiment.
Figure 13B:
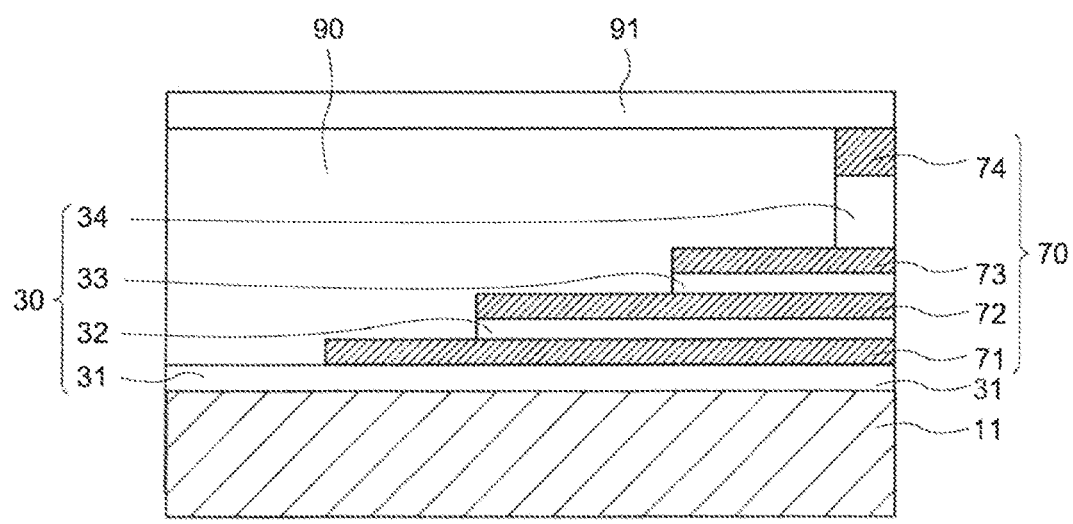
FIG. 13B is a cross-sectional view showing a configuration of a stacked wiring structure according to an embodiment.

FIG. 13A is a top view showing the configuration of the stacked wiring structure 17, and FIG. 13B is a cross-sectional view showing the configuration of the stacked wiring structure 17. Although only four conductive layers are shown in the figure, it is as described above that a larger number of layers such as 33 layers, 65 layers are stacked. Since the configuration of the stacked wiring structure according to the present embodiment is the same as the configuration of the stacked wiring structure according to the first embodiment except that the number of the plurality of conductive layers and the plurality of insulating layers, the description thereof will be omitted here.
[Method of Manufacturing Stacked Wiring Structure]

Referring to FIGS. 14A to 19B, a method of manufacturing the stacked wiring structure 17 according to the present embodiment will be described.

Figure 14A:
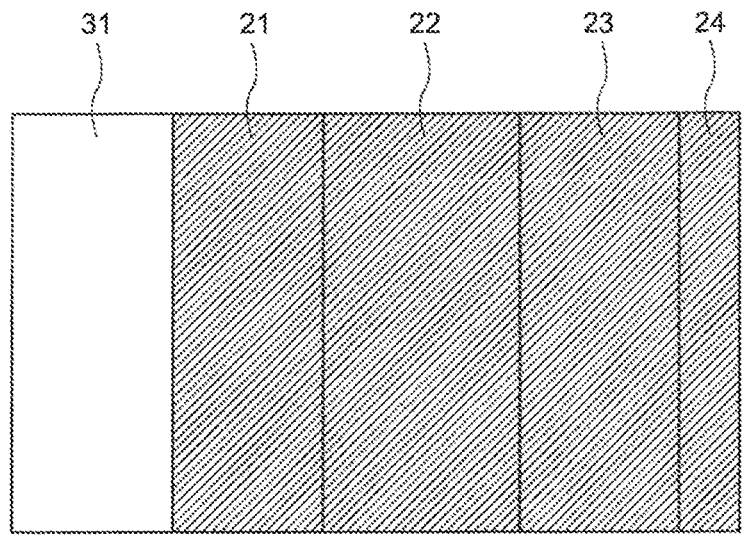
FIG. 14A is a top view showing a method of manufacturing a stacked wiring structure according to an embodiment.
Figure 14B:
FIG. 14B is a cross-sectional view showing a method of manufacturing a stacked wiring structure according to an embodiment.
Figure 14B:
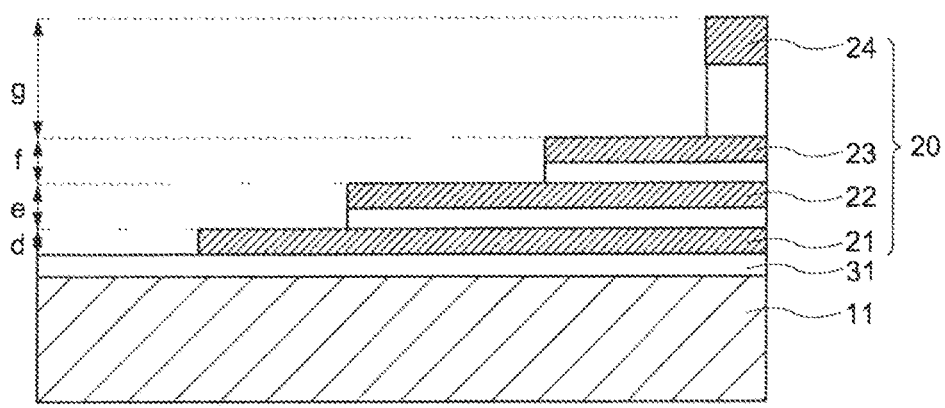

First, as shown in FIG. 14A and FIG. 14B, the insulating layer 31 (TEOS film), the sacrificial layer 21 (SiN film), the insulating layer 32 (TEOS film), the sacrificial layer 22 (SiN film), the insulating layer 33 (TEOS film), the sacrificial layer 23 (SiN film), the insulating layer 34 (TEOS film), and the sacrificial layer 24 (SiN film) are sequentially formed on the semiconductor substrate 11 to form a stacked body. These insulating layers 31, 32, 33, and 34 (TEOS films, when not distinguishing the insulating layers 31, 32, 33, and 34, referred to as the insulating layers 30) and the sacrificial layers 21, 22, 23, and 24 (SiN films, when not distinguishing the sacrificial layers 21, 22, 23, and 24, referred to as the sacrificial layers 20) are deposited, for example, using the CVD apparatus. The alternately stacked insulating layer 30 and the sacrificial layer 20 are formed in contact with each other. The plurality of sacrificial layers 20 and the plurality of insulating layers 30 are formed in a staircase structure to expose a part of the lower sacrificial layer 20, respectively. In the present embodiment, the material of the insulating layer 30 is exemplified by the TEOS film, but the material of the insulating layer 30 is not limited to this, and may be, for example, silicon dioxide ($SiO_2$). In the present embodiment, the material of the sacrifice layer 20 is exemplified by a silicon nitride film (SiN), but the material of the sacrifice layer 20 is not limited to this, and may be, for example, silicon or a metal such as tungsten.

The surface shape of the stepped structure (surface shape of stacked body) having steps is measured by an atomic force microscope (AFM) or the like. A three-dimensional map on the substrate is created by measuring the surface shape of the stepped structure on the substrate. The step information of the upper surfaces of the insulating layer 31 and the sacrificial layers 21, 22, 23, and 24 can be obtained from the three-dimensional map on the substrate. Based on the step information of the upper surfaces of the insulating layer 31 and the sacrificial layers 21, 22, 23 and 24, the surface of the stepped structure is partitioned into a plurality of regions (regions D to G) to be described later according to the height from the semiconductor substrate 11 to the upper surfaces of the insulating layer 31 and the sacrificial layers 21, 22, 23 and 24.

Figure 15A:
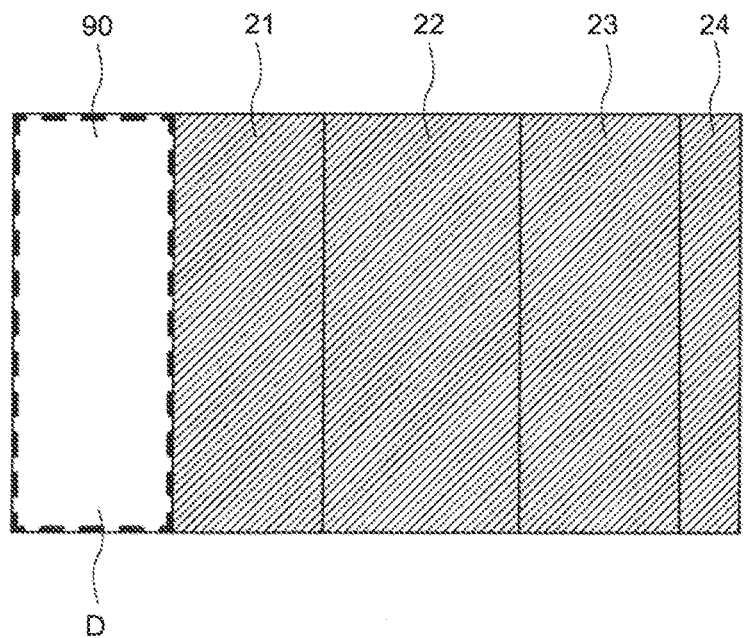
FIG. 15A is a top view showing a method of manufacturing a stacked wiring structure according to an embodiment.
Figure 15B:
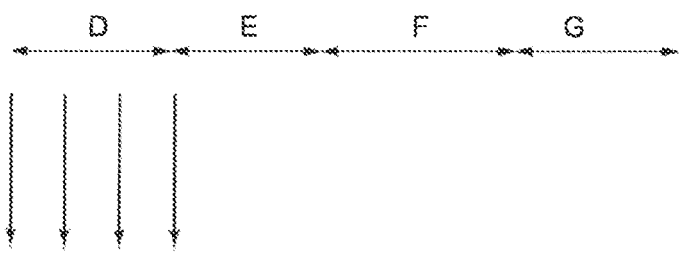
FIG. 15B is a cross-sectional view showing a method of manufacturing a stacked wiring structure according to an embodiment.
Figure 15B:
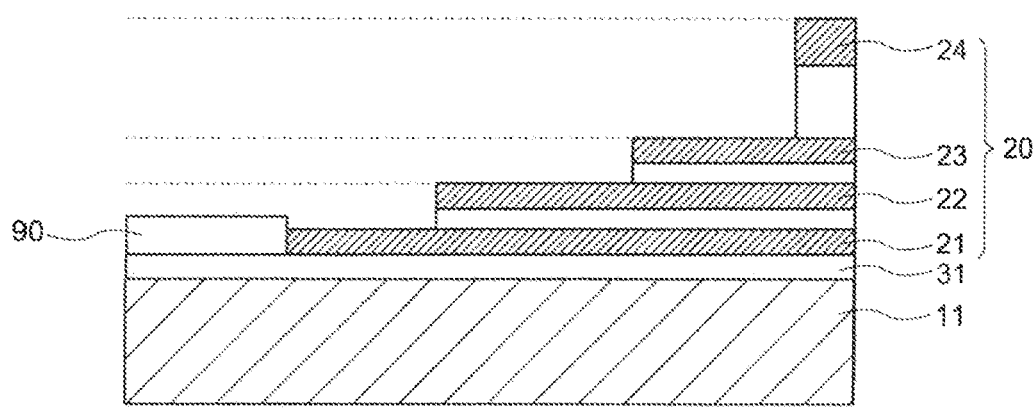

As shown in FIGS. 15A to 18B, the step of the stepped structure (step of the stacked body) is planarized by forming the insulating body 90 by irradiating a specific region with an ion beam using an ion beam irradiation apparatus to be described later. First, as shown in FIG. 15A and FIG. 15B, the insulating body 90 is formed on the insulating layer 31 in a region D by irradiating the ion beam to the region D (the region where the insulating layer 31 is exposed) where the height from the semiconductor substrate 11 to the upper surface of the stacked body is the lowest. The insulating body 90 to be formed on the region D is formed so that the height of the upper surface of the insulating body 90 is higher than the height of the upper surface of the sacrificial layer 21 of a region E (the region where the sacrificial layer 21 is exposed) where the height from the semiconductor layer 11 to the upper surface of the stacked body is the second-lowest. That is, the thickness of the insulating body 90 to be formed on the region D is formed larger than a step of the region D and the region E (the thickness of the sacrificial layer 21) d. The thickness of the insulating body 90 to be formed on the region D is preferably 110% or more and 130% or less of the step of the region D and the region E (the thickness of the sacrificial layer 21) d.

In a case that the insulating body 90 contains silicon dioxide ($SiO_2$), the ion species contained in the ion beam is preferably $SiHx^+$ ion and $O_2^+$ ion. For example, it may be $SiH_4^+$ ion or $SiH_2^+$ ion. By irradiating an ion beam containing such ion species, the insulating body 90 can be formed.

The irradiation amount of the ion beam irradiating the region D can be appropriately adjusted according to the step of the region D and the region E (the thickness of the sacrificial layer 21) d. The irradiation amount of the ion beam can be controlled by the scanning speed, the number of scans, and the density of the ion beam. The irradiation amount of the ion beam is preferably controlled by the scanning speed of the ion beam.

Figure 16A:
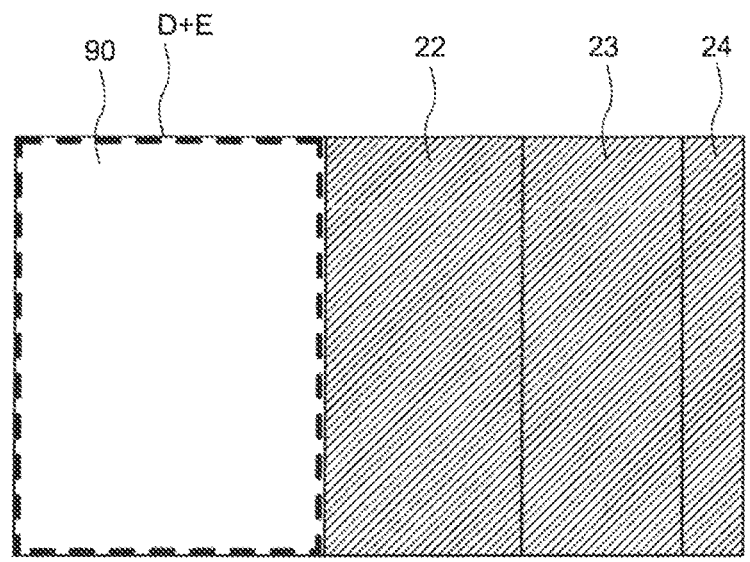
FIG. 16A is a top view showing a method of manufacturing a stacked wiring structure according to an embodiment.
Figure 16B:
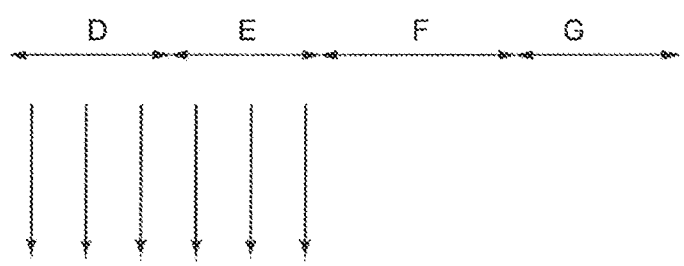
FIG. 16B is a cross-sectional view showing a method of manufacturing a stacked wiring structure according to an embodiment.
Figure 16B:
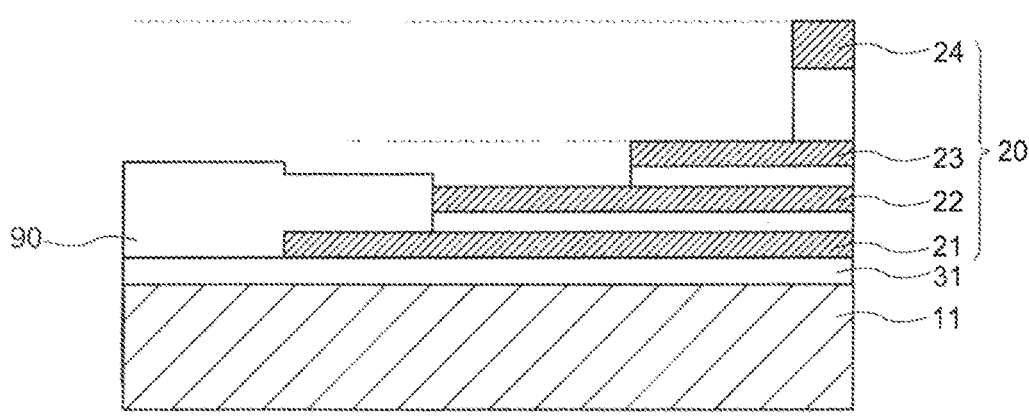

As shown in FIG. 16A and FIG. 16B, the insulating body 90 is formed on the stepped structure in the region D and the region E where the height from the semiconductor substrate 11 to the upper surface of stacked body is the next-lowest after the region D (the region D+E) by irradiating the region D+E with the ion beam. The region E has a higher height from the semiconductor substrate 11 to the upper surface of the stacked body than the region D and does not include the region D.

The insulating body 90 to be formed on the region D+E is formed so that the height of the upper surface of the insulating body 90 is higher than the height of the upper surface of the sacrificial layer 22 of a region F (a region where the sacrificial layer 22 is exposed) where the height from the semiconductor substrate 11 to the upper surface of the stacked body is the third-lowest. That is, the thickness of the insulating body 90 to be formed on the region E is formed larger than the step of the region E and the region F (the thickness of the insulating layer 32 and the sacrificial layer 22) e. The thickness of the insulating body 90 to be formed on the region D+E is preferably 110% or more and 130% or less of the step of the region E and the region F (the thickness of the insulating layer 32 and the sacrificial layer 22) e.

The irradiation amount of the ion beam irradiating the region D+E can be appropriately adjusted according to the step of the region E and the region F (the thickness of the insulating layer 32 and the sacrificial layer 22) e. The irradiation amount of the ion beam irradiating the region E may be larger than the irradiation amount of the ion beam irradiating the region D in FIGS. 15A and 15B. The scanning speed of the ion beam irradiating the region D+E may be smaller than the scanning speed of the ion beam irradiating the region D in FIGS. 15A and 15B. The number of scans of the ion beam irradiating the region D+E may be larger than the number of scans of the ion beam irradiating the region D in FIGS. 15A and 15B. The density of the ion beam irradiating the region D+E may be larger than the density of the ion beam irradiating the region D in FIGS. 15A and 15B.

Figure 17A:
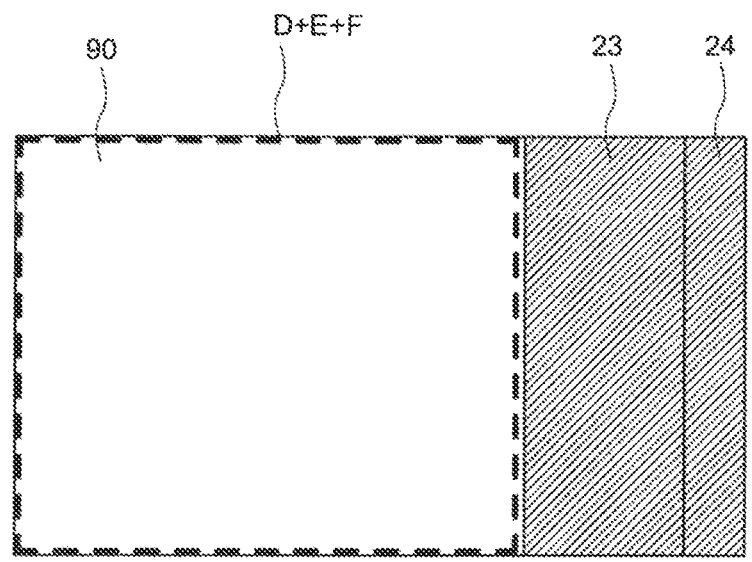
FIG. 17A is a top view showing a method of manufacturing a stacked wiring structure according to an embodiment.
Figure 17B:
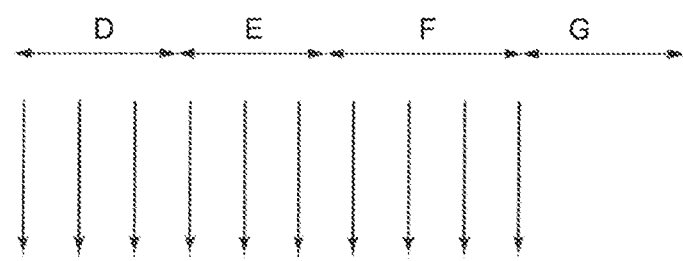
FIG. 17B is a cross-sectional view showing a method of manufacturing a stacked wiring structure according to an embodiment.
Figure 17B:
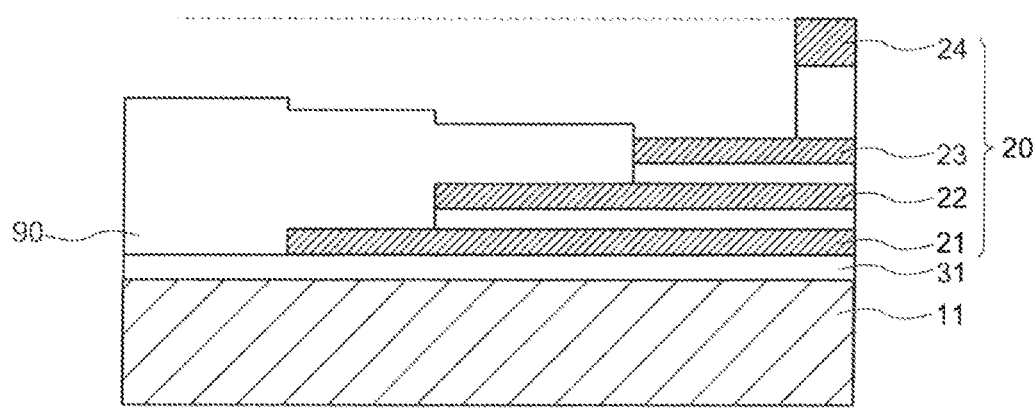

As shown in FIG. 17A and FIG. 17B, the insulating body 90 is formed on the stepped structure in the region D, region E, and region F where the height from the semiconductor substrate 11 to the upper surface of the stacked body is the next-lowest after the region E (the region D+E+F) by irradiating the region D+E+F with the ion beam. The region F has a higher height from the semiconductor substrate 11 to the upper surface of stacked body than the region E and does not include the regions D and E.

The insulating body 90 to be formed on the region D+E+F is formed so that the height of the upper surface of the insulating body 90 is higher than the height of the upper surface of the sacrificial layer 23 of a region G (a region where the sacrificial layer 23 is exposed) where the height from the semiconductor substrate 11 to the upper surface of the stacked body is the fourth-lowest. That is, the thickness of the insulating body 90 to be formed on the region D+E+F is formed larger than the step of the region F and the region G (the thickness of the insulating layer 33 and the sacrificial layer 23) f. The thickness of the insulating body 90 to be formed on the region D+E+F is preferably 110% or more and 130% or less of the step of the region F and the region G (the thickness of the insulating layer 33 and the sacrificial layer 23) f.

The irradiation amount of the ion beam irradiating the region D+E+F can be appropriately adjusted according to the step of the region F and the region G (the thickness of the insulating layer 33 and the sacrificial layer 23) f. The irradiation amount of the ion beam irradiating the region D+E+F may be the same as the irradiation amount of the ion beam irradiating the region D+E in FIGS. 16A and 16B. The scanning speed of the ion beam irradiating the region D+E+F may be the same as the scanning speed of the ion beam irradiating the region D+E in FIGS. 16A and 16B. The number of scans of the ion beam irradiating the region D+E+F may be the same as the number of scans of the ion beam irradiating the region D+E in FIGS. 16A and 16B. The density of the ion beam irradiating the region D+E+F may be the same as the density of the ion beam irradiating the region D+E in FIGS. 16A and 16B.

Figure 18A:
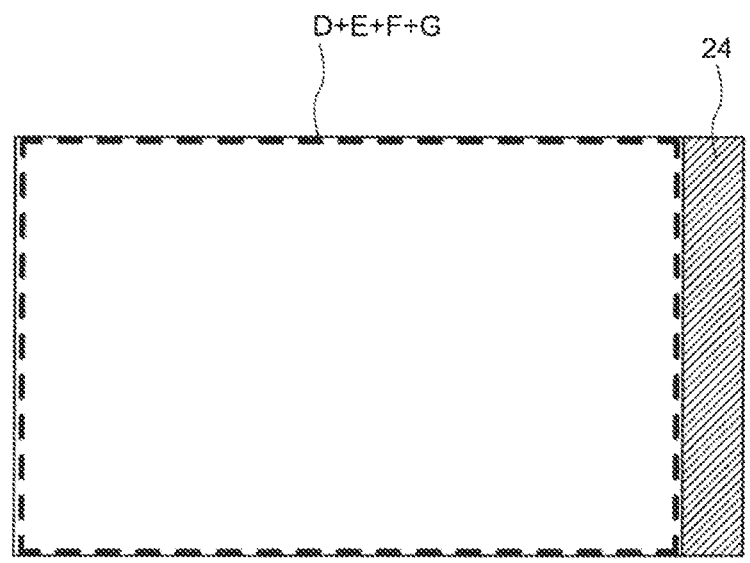
FIG. 18A is a top view showing a method of manufacturing a stacked wiring structure according to an embodiment.
Figure 18B:
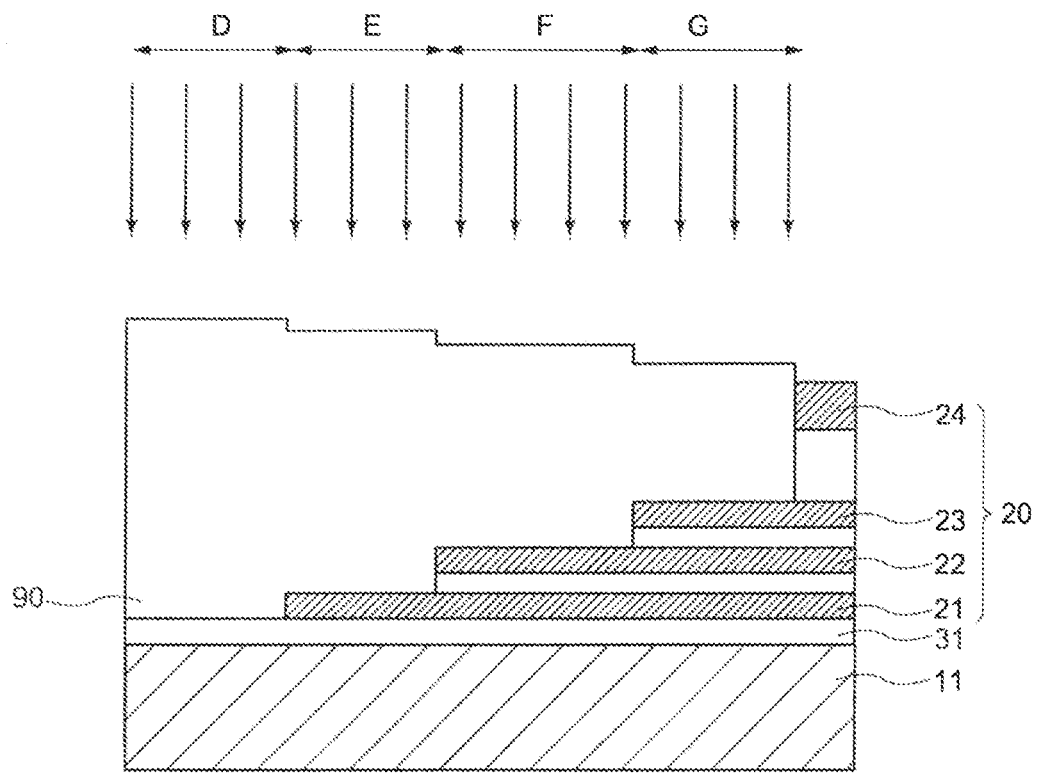
FIG. 18B is a cross-sectional view showing a method of manufacturing a stacked wiring structure according to an embodiment.

As shown in FIG. 18A and FIG. 18B, the insulating body 90 is formed on the stepped structure in the region D, region E, region F, and region G where the height from the semiconductor substrate 11 to the upper surface of the stacked body is the next-lowest after the region F (the region D+E+F G) by irradiating the region D+E+F+G with the ion beam. The region G has a higher height from the semiconductor substrate 11 to the upper surface of the stacked body than the region F and does not include the regions D, E and F.

The insulating body 90 to be formed on the region D+E+F+G is formed so that the height of the upper surface of the insulating body 90 is higher than the height of the upper surface of the sacrificial layer 24 of a region sacrificial layer 24 is exposed where the height from the semiconductor substrate 11 to the upper surface of the stacked body is the fifth-lowest. That is, the thickness of the insulating body 90 to be formed on the region D+E+F+G is formed larger than the step of the region G and the region where the sacrificial layer 24 are exposed (the thickness of the insulating layer 34 and the sacrificial layer 24) g. The thickness of the insulating body 90 formed on the region D+E+F+G is preferably 110% or more and 130% or less of the step of the region G and the region where the sacrificial layer 24 are exposed (thickness of the insulating layer 34 and the sacrificial layer 24) g.

The irradiation amount of the ion beam irradiating region D+E+F+G can be appropriately adjusted according to the step of the region G and the region where the sacrificial layer 24 are exposed (the thickness of the insulating layer 34 and the sacrificial layer 24) g. The irradiation amount of the ion beam irradiating the region D+E+F+G may be larger than the irradiation amount of the ion beam irradiating the region D+E+F in FIGS. 17A and 17B. The scanning speed of the ion beam irradiating the region D+E+F+G may be smaller than the scanning speed of the ion beam irradiating the region D+E+F in FIGS. 17A and 17B. The number of scans of the ion beam irradiating the region D+E+F+G may be larger than the number of scans of the ion beam irradiating the region D+E+F in FIGS. 17A and 17B. The density of the ion beam irradiating the region D+E+F+G may be larger than the density of the ion beam irradiating the region D+E+F in FIGS. 17A and 17B.

In the present embodiment, a method of easily planarizing the stepped structure (the stacked body) having large steps has been shown by dividing the stepped structure into four different regions (the regions D to G) according to the height from the semiconductor substrate 11, and repeatedly forming the film at the region where the height from the semiconductor substrate 11 is low. By irradiating the ion beam four times, the irradiation amount of the ion beam irradiating the region D is larger than the irradiation amount of the ion beam irradiating the region E, the irradiation amount of the ion beam irradiating the region E is larger than the irradiation amount of the ion beam irradiating the region F, and the irradiation amount of the ion beam irradiating the region F is larger than the irradiation amount of the ion beam irradiating the region G. The number of scans of the ion beam irradiating the region D is larger than the number of scans of the ion beam irradiating the region E, the number of scans of the ion beam irradiating the region E is larger than the number of scans of the ion beam irradiating the region F, and the number of scans of the ion beam irradiating the region F is larger than the number of scans of the ion beam irradiating the region G.

In the present embodiment, the stepped structure (the stacked body) having large steps was divided into the four different regions (the regions D to G) according to the height from the semiconductor substrate 11 to the upper surface of the stepped structure. However, the present invention is not limited to this, and finer adjustment is possible by further subdividing the region according to the height from the semiconductor substrate 11 to the upper surface of the stepped structure. In the present embodiment, the method of substantially planarizing the stepped structure has been shown by forming the film on the stepped structure in the order of the region D where the height from the semiconductor substrate 11 is low, the region D+E, the region D+E+F, and the region D+E+F+G. However, the present invention is not limited to this, and the film may be formed on the stepped structure in the order of the region D+E+F G, the region D+E+F, the region D+E, and the region D.

In the present embodiment, the insulating body 90 having a larger film thickness than the respective steps was formed. By forming the thickness of the insulating body 90 larger than the respective steps, it is possible to deal with the film formation unevenness of the insulating body 90.

As described above, the method of manufacturing the semiconductor device according to the present embodiment can substantially planarized the stepped structure having large steps by forming the film by irradiating a specific region with an ion beam of a specific irradiation amount, thereby improving the manufacturing efficiency of the semiconductor device.

The insulating film 91 is formed on the insulating body 90 and the sacrificial layer 27. Further, a slit (not shown) is dug down in a predetermined region of the stacked body, and the sacrificial layer 20 contained in the stacked body is collectively removed from the slit. As a result, a cavity is formed in the portion where the sacrificial layer 20 was present. Then, by embedding a metal such as tungsten in the cavity, the conductive layer 70 shown in FIG. 13A and FIG. 13B is formed.

As described above, the method of manufacturing the semiconductor device according to the present embodiment can easily planarized the stepped structure having large steps by forming the film by irradiating a specific region with an ion beam of a specific irradiation amount, thereby improving the manufacturing efficiency of the semiconductor device.

[Configuration of an Ion Beam Irradiation Apparatus]

A configuration of an ion beam irradiation apparatus according to the present embodiment is the same as the configuration of the ion beam irradiation apparatus according to the first embodiment except that the type and energy of the gas. The same description as that of the first embodiment will be omitted, here will be described portions different from the configuration of the ion beam irradiation apparatus according to the first embodiment.

The plasma generation chamber 200 generates plasma by generating a magnetic field in a vacuum chamber and introducing microwaves. When a gas is introduced in a state where plasma is generated and a predetermined acceleration voltage is applied to an acceleration electrode, an ion beam is generated. The plasma generation chamber 200 may, for example, generate the ion beam containing $SiH_4^+$ ion and $O_2^+$ ion to form silicon dioxide using $SiH_4$ gas and $O_2$ gas. $SiH_2$ gas and NO gas may be used to generate the ion beam containing $SiH_2^+$ ion and $NO^+$ ion, $SiH_2$ gas and $N_2O$ gas may be used to generate the ion beam containing $SiH_2^+$ ion and $N_2O^+$ ion. $SiH_2Cl_2$ gas and $H_2O$ gas may be used to generate the ion beam containing $SiHx^+$ ion. $SiH_2Cl_2$ gas and $H_2O$ gas may be used to generate the ion beam containing $SiH_2Cl_2^+$ ion and $H_2O^+$ ion, $SiH_4$ gas and $CO_2$, $H_2$ gases may be used to generate the ion beam containing $SiH_4^+$ ion, $CO_2^+$ ion, and $H_2^+$ ion. The ion energy at this time is preferably 300 eV or less, for example.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form of the embodiments described herein may be made without departing from the spirit of the inventions. The accompanying claims and their equivalents are intended to cover such forms or modification as would fall within the scope and spirit of the inventions.

What is claimed is:

1. A method of manufacturing a semiconductor device comprising:
   preparing a stepped structure being arranged on a substrate, the stepped structure including a first region and a second region, a height of the stepped structure of the first region being lower than a height of the stepped structure of the second region;
   forming a first film on the first region of the stepped structure by irradiating the first region with an ion beam, and
   after irradiating the first region with the ion beam, forming a second film on the first region and the second region of the stepped structure by irradiating the first region and the second region with the ion beam, an irradiation amount of the ion beam irradiating the first region is smaller than an irradiation amount of the ion beam irradiating the second region,
   wherein,
   the stepped structure includes a first layer and a second layer formed on the first layer,
   each of the first layer and the second layer extends in a direction horizontal to the substrate,
   the first region includes the first layer, and
   the second region includes the first layer and the second layer.

2. The method of manufacturing a semiconductor device according to claim 1, wherein a scanning speed of the ion beam irradiating the first region is larger than a scanning speed of the ion beam irradiating the second region.

3. The method of manufacturing a semiconductor device according to claim 1, wherein a number of scans of the ion beam irradiating the first region is smaller than a number of scans of the ion beam irradiating the second region.

4. The method of manufacturing a semiconductor device according to claim 1, wherein the ion beam contains $SiHx^+$ ions generated from $SiH_2Cl_2$ gas and $H_2O$ gas.

* * * * *